US008593221B1

(12) United States Patent
Zhang et al.

(10) Patent No.: US 8,593,221 B1
(45) Date of Patent: Nov. 26, 2013

(54) METHODS AND CIRCUITS FOR COMMON MODE STABILITY AND BANDWIDTH BROADENING IN TRANSISTOR AMPLIFIERS

(75) Inventors: Liping Zhang, Redondo Beach, CA (US); Thomas W. Krawczyk, Ladera Ranch, CA (US); Andrew J. Bonthron, Los Angeles, CA (US); David A. Rowe, Redondo Beach, CA (US)

(73) Assignee: Semtech Corporation, Camarillo, CA (US)

( * ) Notice: Subject to any disclaimer, the term of this patent is extended or adjusted under 35 U.S.C. 154(b) by 0 days.

(21) Appl. No.: 13/300,500

(22) Filed: Nov. 18, 2011

Related U.S. Application Data

(60) Provisional application No. 61/416,726, filed on Nov. 23, 2010.

(51) Int. Cl.
*H03F 3/45* (2006.01)

(52) U.S. Cl.
USPC .......................................... 330/254; 330/261

(58) Field of Classification Search
USPC ........................... 330/254, 261; 327/359, 530
See application file for complete search history.

(56) References Cited

U.S. PATENT DOCUMENTS

| | | | | |
|---|---|---|---|---|
| 5,942,934 A | * | 8/1999 | Ngo et al. | 327/540 |
| 6,255,889 B1 | * | 7/2001 | Branson | 327/359 |
| 7,697,915 B2 | * | 4/2010 | Behzad et al. | 455/311 |
| 8,198,933 B2 | * | 6/2012 | Saverio | 327/355 |

* cited by examiner

*Primary Examiner* — Steven J Mottola

(74) *Attorney, Agent, or Firm* — McDermott Will & Emery LLP

(57) ABSTRACT

Examples of circuits and methods are provided for common mode stability and bandwidth broadening. A current generator circuit may include a first and a second transistor. Each of the first and second transistors includes a first, second, and third terminal. The first and second transistors provide a first and a second output current at their corresponding third terminals. A first branch including a first resistor and a first capacitor coupled in series is coupled between the third terminal of the first transistor and the first terminal of the second transistor. A second branch including a second resistor and a second capacitor coupled in series is coupled between the third terminal of the second transistor and the first terminal of the first transistor. The first and the second branches are configured to enable the current generator circuit to provide the first and second currents with improved common mode stability.

22 Claims, 21 Drawing Sheets

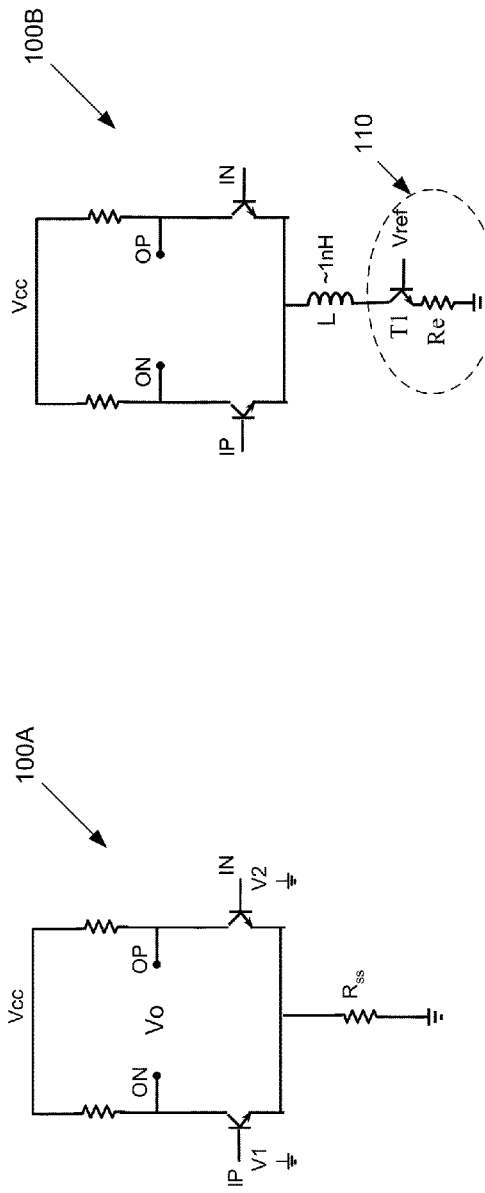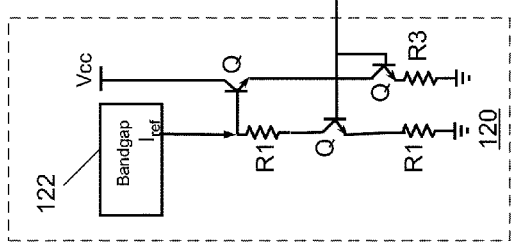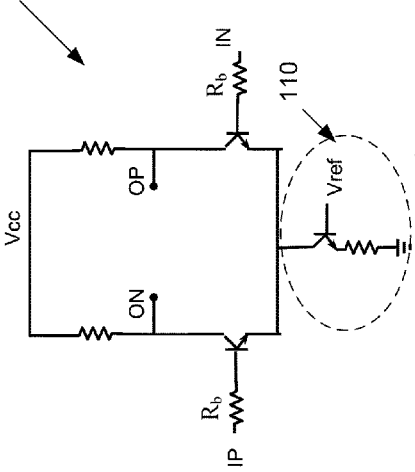

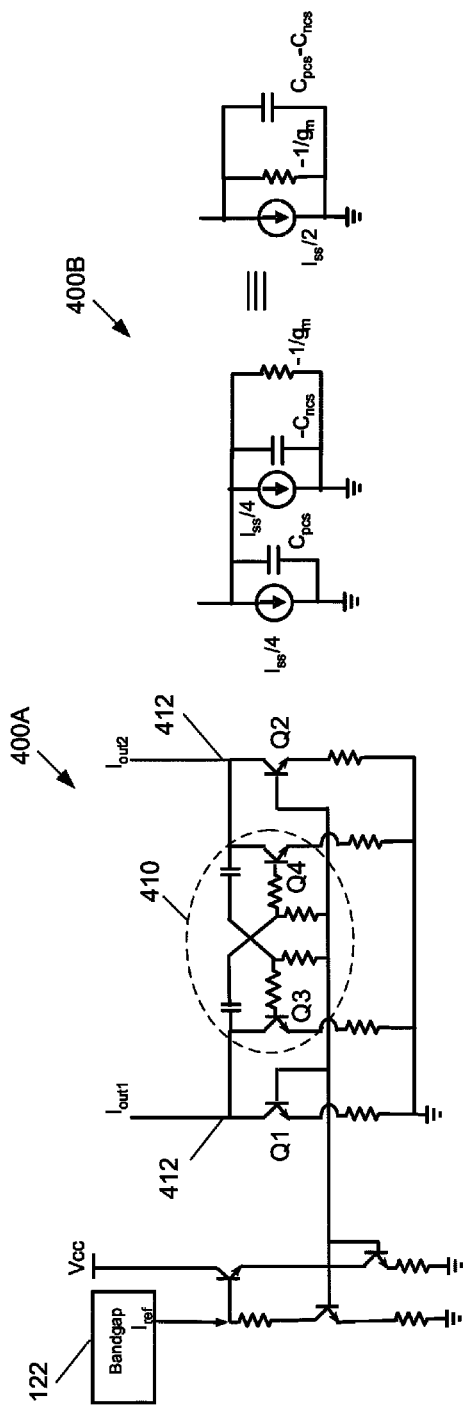
Figure 4A
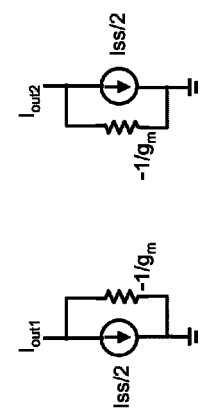
Figure 4B
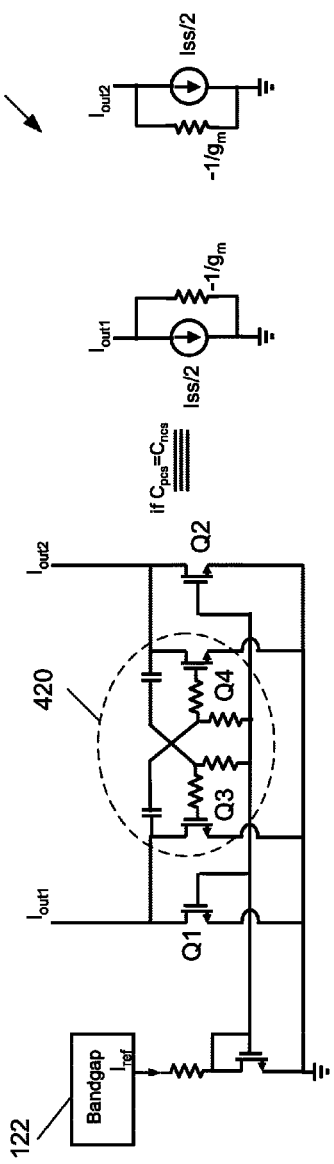
Figure 4C
Figure 4D

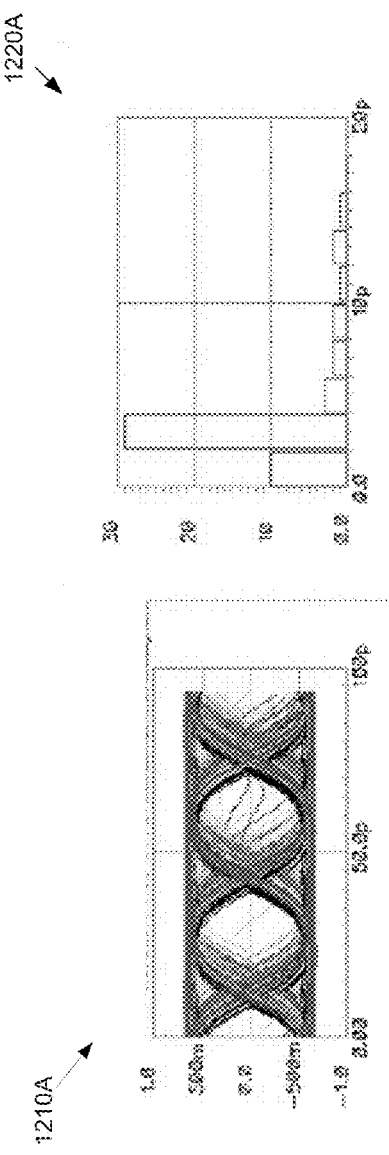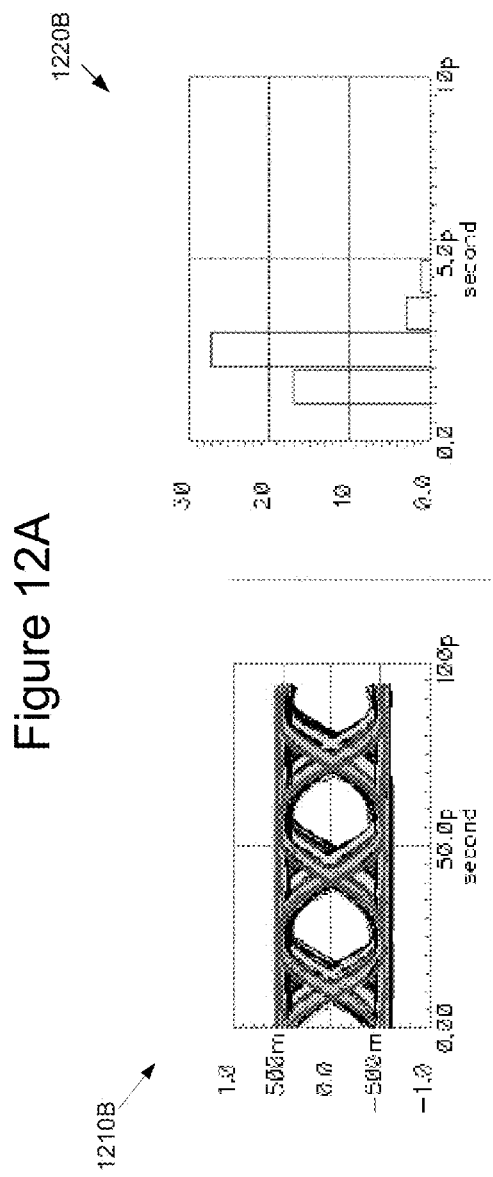
Figure 12A
Figure 12B

METHODS AND CIRCUITS FOR COMMON MODE STABILITY AND BANDWIDTH BROADENING IN TRANSISTOR AMPLIFIERS

CROSS-REFERENCES TO RELATED APPLICATIONS

The present application claims the benefit of priority from U.S. Provisional Patent Application Ser. No. 61/416,726, entitled, "SYSTEMS AND METHODS FOR COMMON MODE STABILITY IN HIGH-FT TRANSISTOR AMPLIFIERS," filed on Nov. 23, 2010, which is hereby incorporated by reference in its entirety for all purposes.

FIELD

The disclosure relates in general to analog, RF, microwave or millimeter wave circuit design, and more particularly to, methods and circuits for common mode stability and bandwidth broadening in transistor amplifiers.

BACKGROUND

Many electronic circuits benefit from advantages of differential transistor pairs in implementing various amplifier, driver, mixer, or buffer circuits. A basic differential pair may comprise two transistors, for example, bipolar or MOS transistors. In a typical differential pair, the bases or gates of the transistors may form the input nodes and the collectors or drains of the transistors may form the output nodes of the differential pair. The emitters or sources of the transistors may be coupled through a tail circuit that may include a resistor, an inductor, a current source, or a combination of thereof to the ground potential or a negative power supply voltage. Biasing of the differential pair is normally provided via the tail circuit.

The current source may in turn be formed by one or more differential pairs that are biased by stable reference sources such as current sources which are adequately independent from temperature variations. The stability and operating frequency bandwidth of a circuit using the differential pair that employs the current source or the current source itself may be significantly affected by the stability and the bandwidth of the current source.

SUMMARY

In one aspect, a method may comprise operating a current generator circuit including coupling the current generator circuit to a first circuit and providing, to the first circuit, a first output current and a second output current. The current generator circuit may include a first transistor including a first, second, and third terminal. The first transistor may be configured to provide the first output current at the third terminal of the first transistor, which comprises an output terminal of an output terminal pair of the current generator circuit. The current generator circuit may include a second transistor including a corresponding first, second, and third terminal. The second transistor may be configured to provide the second output current at the third terminal of the second transistor, which comprises another output terminal of the output terminal pair of the current generator circuit. A first branch, including a first resistor and a first capacitor coupled in series, may be coupled between the third terminal of the first transistor and the first terminal of the second transistor. A second branch, including a second resistor and a second capacitor coupled in series, may be coupled between the third terminal of the second transistor and the first terminal of the first transistor. The first and the second branches may be configured to enable the current generator circuit to provide the first and second current sources with an improved common mode stability.

In one aspect, a current generator circuit may comprise a first and a second transistor. Each of the first and second transistors includes a first, second, and third terminal. The first and second transistors provide a first and a second output current at their corresponding third terminals. A first branch including a first resistor and a first capacitor coupled in series is coupled between the third terminal of the first transistor and the first terminal of the second transistor. A second branch including a second resistor and a second capacitor coupled in series is coupled between the third terminal of the second transistor and the first terminal of the first transistor. The first and the second branches are configured to enable the current generator circuit to provide the first and second currents with improved common mode stability.

It is understood that various configurations of the subject technology will become readily apparent to those skilled in the art from the disclosure, wherein various configurations of the subject technology are shown and described by way of illustration. As will be realized, the subject technology is capable of other and different configurations and its several details are capable of modification in various other respects, all without departing from the scope of the subject technology. Accordingly, the summary, drawings and detailed description are to be regarded as illustrative in nature and not as restrictive.

BRIEF DESCRIPTION OF THE DRAWINGS

FIG. 1A is a circuit diagram illustrating an example of a differential amplifier circuit using an emitter resistor to provide a tail current.

FIG. 1B is a circuit diagram illustrating an example of a differential amplifier circuit using an inductor and a tail current source.

FIG. 1C is a circuit diagram illustrating an example of a differential amplifier circuit using a tail current source and series base resistors for stability.

FIG. 1D is a circuit diagram illustrating an example of a differential amplifier circuit biased using a reference circuit.

FIG. 4A is a circuit diagram illustrating an example of a bipolar-transistor current generator circuit with common mode stability and bandwidth broadening.

FIG. 4B is a circuit diagram illustrating an example of an equivalent circuit of the current generator circuit of FIG. 4A.

FIG. 4C is a circuit diagram illustrating an example of a MOS-transistor current generator circuit with common mode stability and bandwidth broadening.

FIG. 4D is a circuit diagram illustrating an example of an equivalent circuit of the current generator circuit of FIG. 4C.

FIG. 12A is a diagram illustrating example Monte Carlo simulation results of a typical line driver amplifier.

FIG. 12B is a diagram illustrating example Monte Carlo simulation results of the line driver amplifier circuit of FIG. 11.

DETAILED DESCRIPTION

Figure 2:
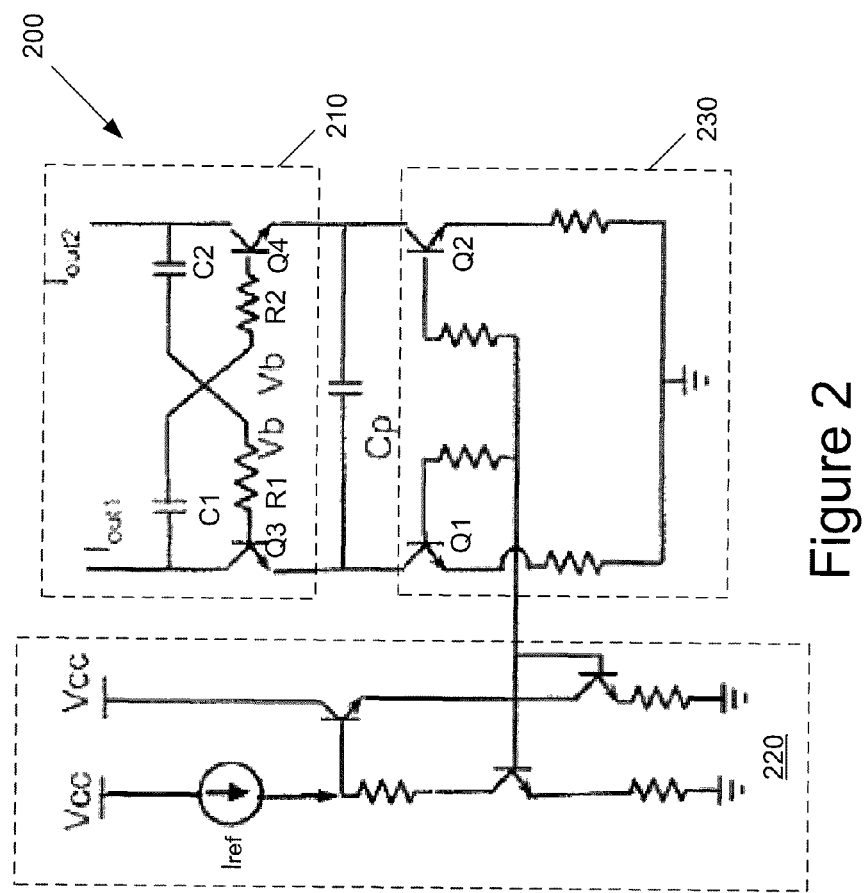
FIG. 2 is a circuit diagram illustrating an example of a current generator circuit with common mode stability and bandwidth broadening.

The detailed description set forth below is intended as a description of various configurations of the subject technology and is not intended to represent the only configurations in which the subject technology may be practiced. The appended drawings are incorporated herein and constitute a part of the detailed description. The detailed description includes specific details for the purpose of providing a thorough understanding of the subject technology. However, it will be apparent to those skilled in the art that the subject technology may be practiced without these specific details. In some instances, well-known structures and components are shown in block diagram form in order to avoid obscuring the concepts of the subject technology. Like components are labeled with identical element numbers for ease of understanding.

FIG. 1A is a circuit diagram illustrating an example of a differential amplifier circuit 100A using an emitter resistor $R_{SS}$ to provide a tail current. Differential amplifier 100A is a typical differential amplifier, with respective positive and negative differential input nodes IP and IN and corresponding negative and positive differential output nodes ON and OP. A differential input signal is defined as the difference between an input voltage V1 applied to the positive input node IP and an input voltage V2 applied to the negative input node IN of differential amplifier 100A. A differential input voltage signal (i.e., Vid=V1−V2) is amplified by a negative (or positive) gain when observed at the negative (or positive) output node ON (or OP) of differential amplifier 100A. A common mode signal is defined as an average value of the input signals V1 and V2 (i.e., Vic=0.5*(V1+V2)). For a differential amplifier (e.g., differential amplifier 100 A), a differential mode gain $A_d$ is defined as $A_d$=Vo/Vid, when Vic is equal to zero (i.e., V2=−V1), where Vo is the output voltage as measured between output nodes ON and OP. A common mode gain $A_c$ is defined as $A_c$=Vo/Vic, when V1d is equal to zero (i.e., V2=V1). Using these gains the output voltage V0 can be expressed as: Vo=Vod+Voc=$A_d$*Vid+$A_c$*Vic. Therefore, output voltage V0 may be non-zero (i.e., $A_c$*Vic), even when no differential signal is applied to input nodes IP and IN (i.e., V1=V2), in which case, a common mode signal, Voc=$A_c$*Vic, may be measured between output nodes (e.g., IP and IN). Normally, the common mode signal is not a desired signal. A well-know parameter of differential amplifier circuits, i.e., common mode rejection ratio (CMRR) defined by 20 $\log_{10}$ ($A_d/A_c$), is a measure of the tendency of the differential amplifier circuit to reject the common mode signal (i.e., Vic). The common mode signal may be due to bias voltages or noise at input nodes (e.g., IP and IN). Oscillation of the common mode signal Voc may result in common mode instability of the amplifier. A simple way to somewhat reduce such oscillations is to use a resistor $R_{ss}$ between the coupled emitters of the differential pair and the ground potential. Using resistor $R_{ss}$, however, does not provide unconditional instability to the differential amplifier.

FIG. 1B is a circuit diagram illustrating an example of a differential amplifier circuit 100B using an inductor L and a tail current source 110. In differential amplifier circuit 100 B, the emitter resistor $R_{ss}$ of FIG. 100A is replaced by an inductor L and tail current source 110. The tail current source 110 is a typical emitter follower formed by a transistor T1 and an emitter resistor Re. Inductor L may comprise a large inductor (e.g., of the order of 1 nH). The combination of inductor L and tail current source 110 may somewhat reduce common mode instability of the differential amplifier circuit 100B. The relative common mode stability of the differential amplifier 100B, however, may only be provided over a narrow bandwidth. Moreover implementation of inductor L may consumes valuable chip real estate.

FIG. 1C is a circuit diagram illustrating an example of a differential amplifier circuit 100C using a tail current source 110 and series base resistors $R_b$. In differential amplifier circuit 100C, tail current source 110 and base resistors $R_b$ are somewhat effective in reducing common mode instability of the differential amplifier, but not as desired in most application. Furthermore, differential amplifier circuit 100C may suffer from a gain penalty due to base resistors $R_b$ and may not be able to provide desired noise figure (NF) (e.g., 1.5-2 dB).

FIG. 1D is a circuit diagram illustrating an example of a differential amplifier circuit 100D biased using a reference circuit 120. In differential amplifier 100D, each output current (e.g., $I_{out1}$ and $I_{out2}$) is provided with two transistors in parallel (e.g., paralleled Q1 and Q3 and paralleled Q2 and Q4), which allow for higher output current. Transistors Q1, Q3, Q2, and Q4 are biased via reference circuit 120. Reference circuit 120 is in turn biased with a bandgap current source 122, which is configured to provide a temperature independent reference current $I_{ref}$. If transistors Q1, Q3, Q2, and Q4 and transistors Q of reference circuit 120 have equal sizes, the value of output currents $I_{out1}$ and $I_{out2}$ are determined by the ratio of n=R1/R. In many reference circuits (e.g., reference circuit 120) R3>>R1. Differential amplifier circuit 100D may not, however, provide desired features such as low NF, unconditional common mode stability, and broad frequency bandwidth that the current sources disclosed herein can provide according to aspects of the subject technology.

FIG. 2 is a circuit diagram illustrating an example current generator circuit 200 with common mode stability and bandwidth broadening. Current generator circuit 200 includes a core circuit 210, a differential pair 230 and a reference circuit 220. Reference circuit 220 is similar to reference circuit 120 of FIG. 1D and functions similarly. Difference amplifier pair 230 is similar to differential amplifier 100D of FIG. 1D, except that parallel transistors are replaced with single transistors. In some aspect, differential pair 230 may be replaced by differential amplifier 100D. The core circuit 210 comprises a cascode structure including transistors Q3 and Q4, which are cross-coupled via cross-coupling branches formed by resistor R1 and capacitor C1 and resistor R2 and capacitor C2. Capacitor Cp may represent a parasitic capacitance seen from collectors of transistors Q1 and Q2.

In core circuit 210 respective values of resistances and capacitances of resistors R1 and R2 and capacitors C1 and C2 are determined such that the current generator circuit 200 is unconditionally stable and enjoys a broad frequency bandwidth. In some aspects, resistance values of resistor R1 and R2 can be the same and capacitance values of capacitors C1 and C2 can also be the same. In core circuit 210, the parasitic capacitance seen from the collectors of transistors Q3 and Q4 are negative at some frequency ranges, and the common mode pole may be shifted so that the stability of common mode is improved significantly. In some aspects, transistors Q1-Q4 may comprise high-ft transistors. In one aspect, transistors Q1-Q4 may comprise MOS transistors.

Figure 3A:
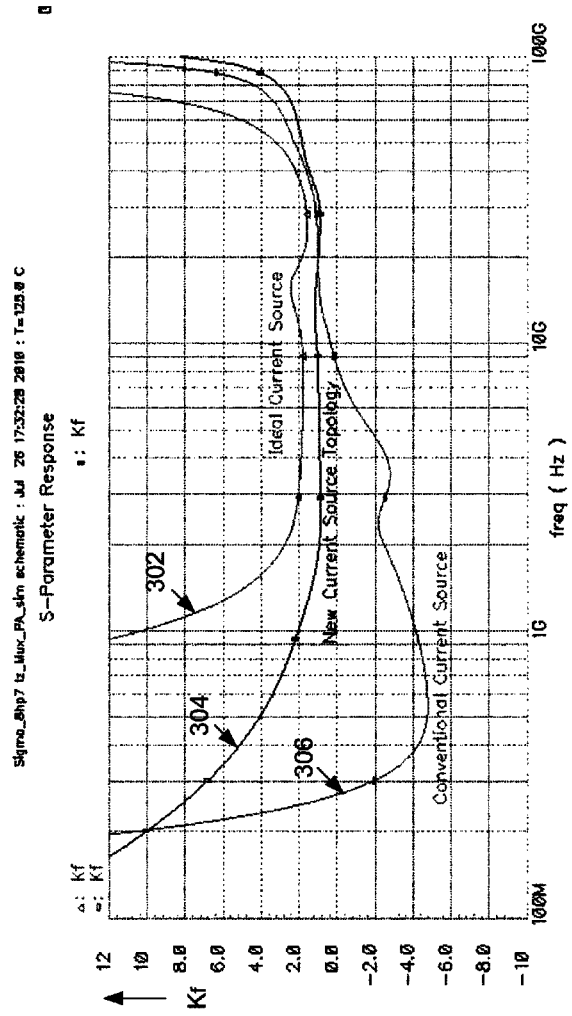
FIG. 3A is a diagram illustrating the comparison of stability K-factors of an exemplary amplifier using conventional current source, ideal current source and the proposed current generator circuit of FIG. 2.

FIG. 3A is a diagram illustrating the comparison of stability K-factors of an amplifier using conventional current source, ideal current source and the proposed circuit 200 of FIG. 2. Stability K-factors includes stability K-factor diagrams 302, 304 and 306, respectively corresponding to an ideal current source, the presently disclosed current source (e.g., current generator circuit 200), and a conventional current source. The stability K-factor diagrams 302, 304, and 306 represent common mode (CM) stability factor $K_f$, which is defined as follows:

$K_f=(1-|S_{11}|^2-|S_{22}|^2+|\Delta|^2)/(2|S_{21}S_{12}|)$ where, $\Delta=S_{11}S_{22}-S_{12}S_{21}$, and $S_{11}$, $S_{22}$, $S_{12}$, $S_{21}$ are the S-parameters associated with a circuit, such as current generator circuit 200, and are frequency dependent. In stability K-factor diagrams 302, 304, and 306, the vertical axis represent CM stability factor $K_f$, whereas the horizontal axis represents operating frequency on a logarithmic scale. A circuit is said to have unconditional stability in a frequency range if the CM stability factor $K_f$ associated with that circuit in that frequency range is greater than one (i.e., $K_f>1$).

An ideal current source, defined for the purpose of discussion here, as being unconditionally stable over an unlimited frequency range, may have a $K_f$ as shown in stability K-factor diagram 302. Stability K-factor diagram 304, representing variation with frequency of the CM stability factor $K_f$ for current generator circuit 200, shows that current generator circuit 200 enjoys unconditional instability over the entire frequency range. This shows a great improvement over the stability K-factor diagram 306 for a conventional current source, which is unstable in almost the entire operating frequency range of interest (e.g., 0.2-20 GHz) in many applications.

Figure 3B:
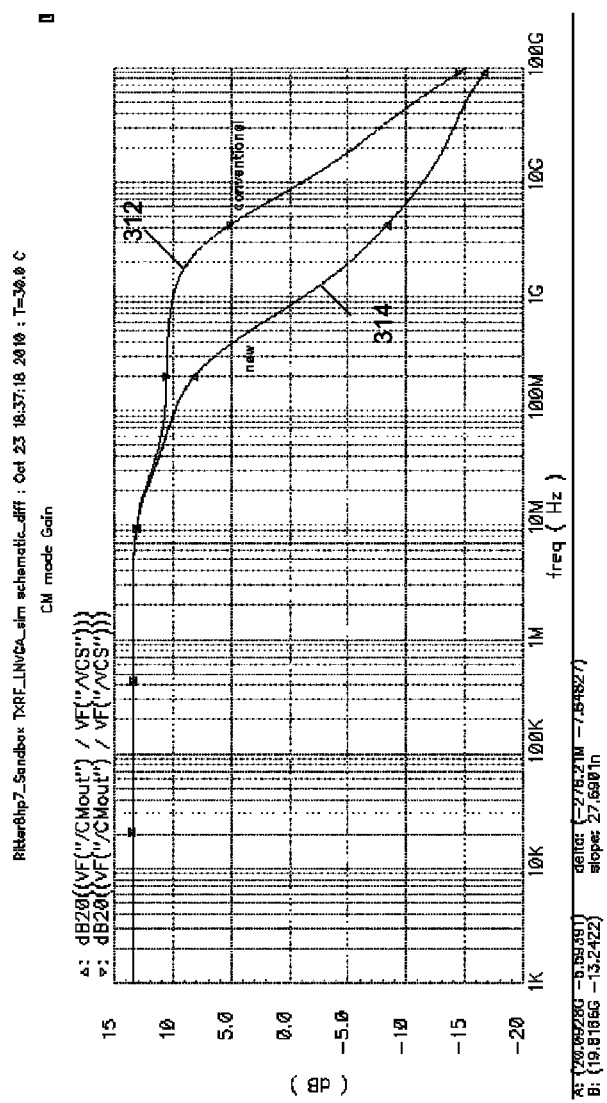
FIG. 3B is a diagram illustrating the comparison of common mode gain vs. frequency responses of an exemplary conventional current source and the current generator circuit of FIG. 2.

FIG. 3B is a diagram illustrating the comparison of common mode gain vs. frequency responses of a conventional current source and the current generator circuit 200 of FIG. 2. Frequency response 312 is associated with a CM gain of a conventional current source (e.g., one of current sources 100A-100D of FIG. 1). Frequency response 314 represent a CM gain of current generator circuit 200, which shows a drastic improvement over the frequency response 312. This is because for the range of operating frequencies of interest (e.g., 0.2-20 GHz), frequency response 314 shows lower values of CM gain, which are desirable (i.e., better rejects the common mode signal and has a higher CMRR value). For example, at operating frequency of 1 GHz, the CM gain of current generator circuit 200 is shown to be approximately 12 dB lower than the CM gain of the conventional current source.

Figure 3C:
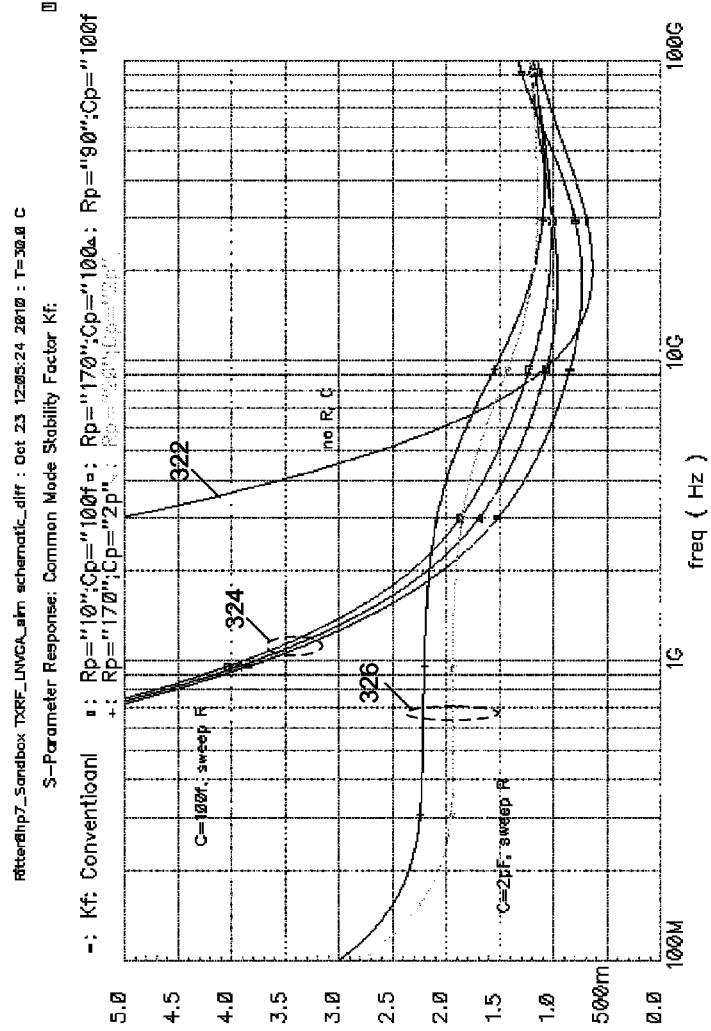
FIG. 3C is a diagram illustrating the comparison of stability K-factor for various values of R and C in the current generator circuit of FIG. 2.

FIG. 3C is a diagram illustrating the comparison of stability K-factor for various values of R and C in the current generator circuit 200 of FIG. 2. Stability K-factors are shown as variations of CM stability factors (i.e., $K_f$) as a function frequency. The vertical axis in stability K-factor diagrams 322, 324, and 326 is CM stability factor $K_f$ and the horizontal axis is operating frequency. Frequency response diagrams 322, 324, and 326 correspond to current generator circuit 200 of FIG. 2 with different values of R (e.g., R1=R2) and C (e.g., C1=C2).

Stability K-factor diagrams 322 corresponds to a scenario where R and C are open circuits (i.e., R=infinity and C=0, e.g., a conventional current source). Stability K-factor diagrams 324 correspond to a fixed value of capacitance (e.g., 100 fF) for capacitor C and where values of resistors R are changed (e.g., swept). Stability K-factor diagrams 326 correspond to another fixed value of capacitance (e.g., 100 fF) for capacitor C and where value of resistors R are changed. The diagrams show that the conventional current source is unstable over part of the operating frequency of interest (e.g., f>10 GHz), while current source 200 is unconditionally stable ($K_f$>1) when, for example, C=2 pF and R is varied (e.g., to have values of 10, 170, and 90 Ohm). With a capacitance value of C=100 pF, unconditionally stability ($K_f$>1) exists for certain resistance values of resistors R (e.g., 170 Ohm).

Figure 3D:
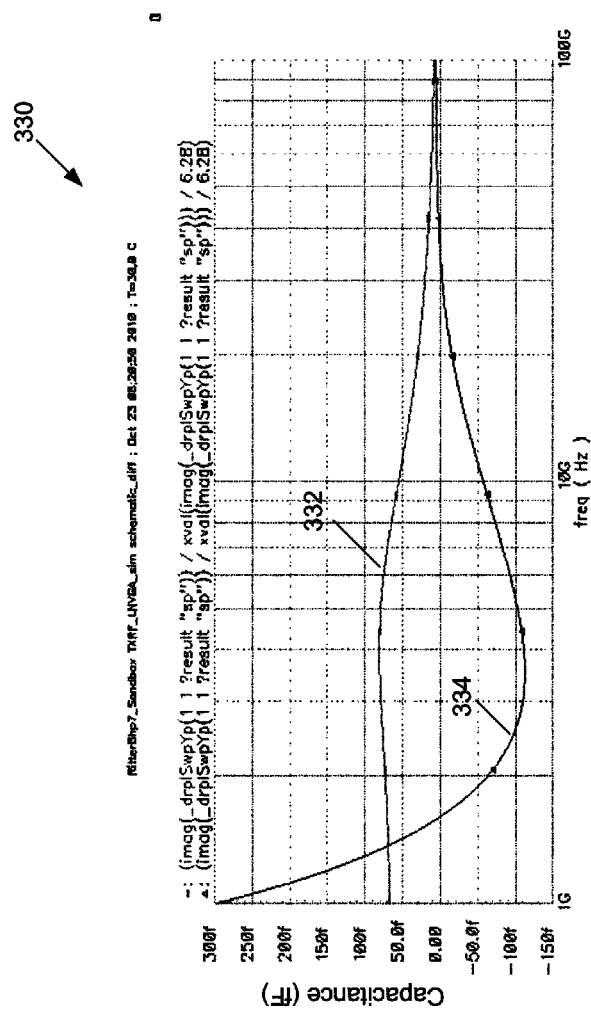
FIG. 3D is a diagram illustrating an exemplary variation of node capacitances at output nodes of the current generator circuit of FIG. 2.

FIG. 3D is a diagram illustrating an example variation with frequency of node capacitances at output nodes of the current generator circuit 200 of FIG. 2. The vertical axis represents capacitance values and the horizontal axis is operating frequency. Frequency response diagrams 332, 324 correspond to a conventional current source and current generator circuit 200, respectively. The capacitance values for current generator circuit 200 are much smaller than for the conventional current source due to the negative capacitance introduced by core circuit 210 of FIG. 2, which reduces the net capacitances seen for output nodes of current generator circuit 200, as will be discussed in more detail herein.

FIG. 4A is a circuit diagram illustrating an example of a bipolar-transistor current generator circuit 400A with common mode stability and bandwidth broadening. In current generator circuit 410 the cross-coupling branches used in current generator circuit 200 of FIG. 2 are applied to the current source 100D of FIG. 1D. In other words, transistors Q3 and Q4 of current source 100D are cross coupled via the cross-coupling branches to form a core circuit 410, which plays an important role of broadening operating frequency response and unconditionally stabilizing the common mode gain of current source 400A.

FIG. 4B is a circuit diagram illustrating an example equivalent circuit 400B of the current generator circuit 400A of FIG. 4A. In the equivalent circuit 400B, which is seen from one of the output nodes 412, the negative capacitance (e.g., $-C_{ncs}$) corresponds to core circuit 410 and reduces the capacitance $C_{pcs}$ seen from collector of any of transistors Q1 or Q2.

FIG. 4C is a circuit diagram illustrating an example of a MOS-transistor current generator circuit 400C with common mode stability and bandwidth broadening. Current generator circuit 400C is similar to current generator circuit 400A, except that the bipolar transistors are replaced with MOS transistors.

FIG. 4D is a circuit diagram illustrating an example of an equivalent circuit 400D of the current generator circuit of FIG. 4C. In equivalent circuit 400D the equivalent negative capacitance of the cross coupling branches of core circuit 420 is equal (i.e. in magnitude) to capacitance of any of MOS transistors Q1 or Q2 as seen from their respective drain terminals.

Figure 5B:
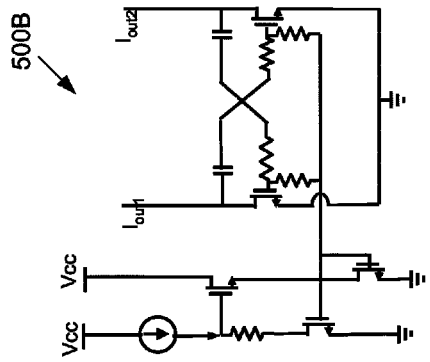
FIG. 5B is a circuit diagram illustrating an example of a MOS-transistor current generator circuit with common mode stability and bandwidth broadening.
Figure 5A:
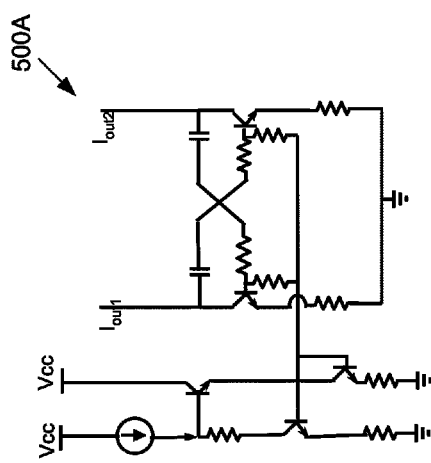
FIG. 5A is a circuit diagram illustrating an example of a bipolar-transistor current generator circuit with common mode stability and bandwidth broadening.

FIG. 5A is a circuit diagram illustrating an example of a bipolar-transistor current generator circuit 500A with common mode stability and bandwidth broadening. Current generator circuit 500A is a variation of current generator circuit 400A, in which transistors Q3 and Q4 are eliminated. Otherwise, in terms of functionality the current sources are similar and current generator circuit 400A can provide output currents $I_{out1}$ and $I_{out2}$ to other circuits while affording CM gain stability and broad frequency response.

FIG. 5B is a circuit diagram illustrating an example of an MOS-transistor current generator circuit 500 B with common mode stability and bandwidth broadening. Current generator circuit 500B is similar to current generator circuit 500A, except that bipolar transistors are replaced with corresponding MOS transistors. Current generator circuit 500A can provide output currents $I_{out1}$ and $I_{out2}$ to other circuits while affording CM gain stability and broad frequency response.

Figure 6B:
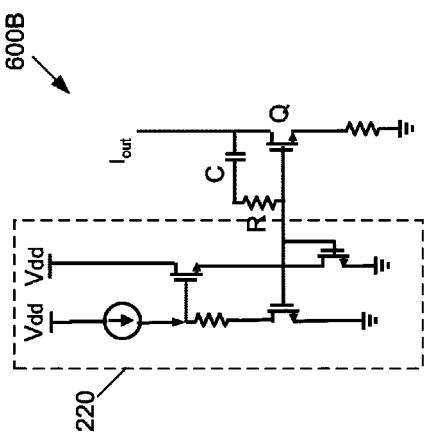
FIG. 6B is a circuit diagram illustrating an example of a single-ended MOS-transistor current generator circuit with bandwidth broadening.
Figure 6A:
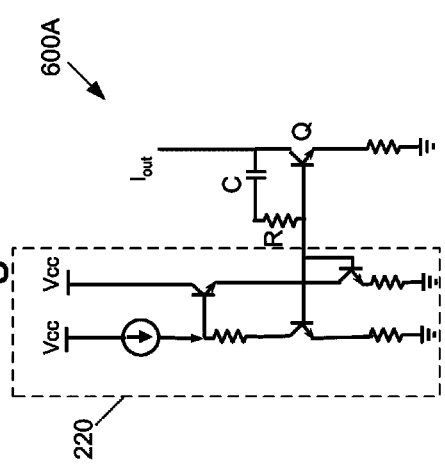
FIG. 6A is a circuit diagram illustrating an example of a single-ended bipolar-transistor current generator circuit with bandwidth broadening.

FIG. 6A is a circuit diagram illustrating an example of a single-ended bipolar-transistor current generator circuit 600A with bandwidth broadening. Current generator circuit 600A is a non-cross coupled, i.e., single-ended, variation of current generator circuit 500A of FIG. 5A, which can provide an $I_{out}$ with unconditional CM stability to a non-differential circuit such as a non-differential amplifier, line driver, or the like.

FIG. 6B is a circuit diagram illustrating an example of a single-ended MOS-transistor current generator circuit 600B with bandwidth broadening. Current generator circuit 600B is similar to current generator circuit 600A of FIG. 6A, except that bipolar transistors are replaced with MOS transistor. In other words, current generator circuit 600B is a non-cross coupled, i.e., single-ended variation, of current generator circuit 500B of FIG. 5B, which can provide a current $I_{out}$ with unconditional CM stability to a non-differential circuit such as a non-differential amplifier, line driver, or the like.

Figure 7B:
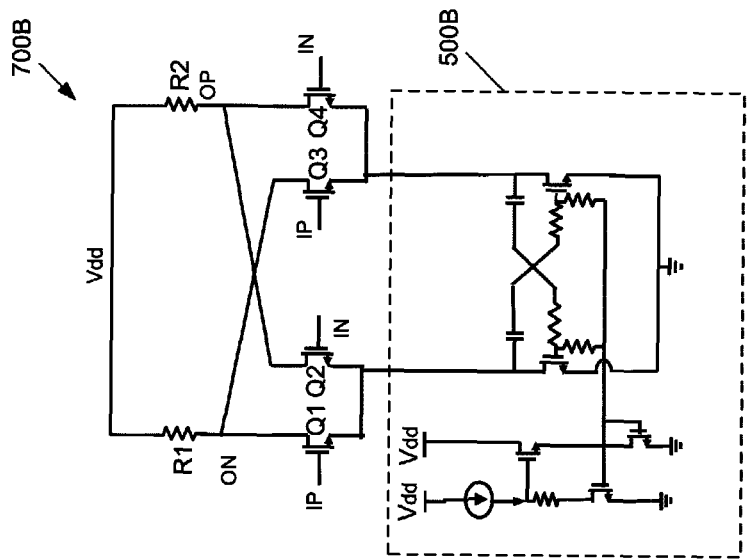
FIG. 7B is a circuit diagram illustrating an example of a common source amplifier employing the current generator circuit of FIG. 5B.
Figure 7A:
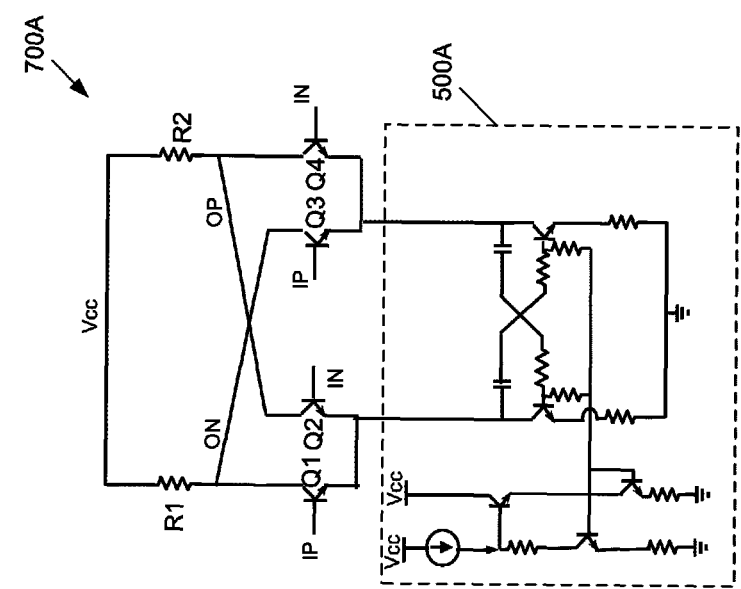
FIG. 7A is a circuit diagram illustrating an example of a common emitter amplifier employing the current generator circuit of FIG. 5A.

FIG. 7A is a circuit diagram illustrating an example of a common emitter amplifier 700A employing the current generator circuit 500A of FIG. 5A. Common emitter amplifier 700A is a pair of differential amplifiers each biased by using an output current of current generator circuit 500A. The first differential amplifier is formed by transistors Q1 and Q2 and the second differential amplifier is formed by transistors Q3 and Q4. Transistors Q1 and Q3 share load resistor R1 and transistors Q2 and Q4 share load resistor R2. This way of coupling the two differential amplifiers provide for better performance in terms of mismatch. The configuration may also help in alleviating self-heating of transistors Q1-Q4. Common emitter amplifier 700A benefits from unconditional CM stability and broad operating frequency bandwidth by employing output currents of current generator circuit 500A, which provide unconditional CM stability and broad operating frequency bandwidth.

FIG. 7B is a circuit diagram illustrating an example of a common source amplifier 700B employing the current generator circuit 500B of FIG. 5B. The structure and function of common source amplifier 700B is substantially similar to common emitter amplifier 700A of FIG. 7A, except that bipolar transistors are replaced with MOS transistors. Common source amplifier 700B benefits from unconditional CM stability and broad operating frequency bandwidth by employing output currents of current generator circuit 500B, which provide unconditional CM stability and broad operating frequency bandwidth.

Figure 8B:
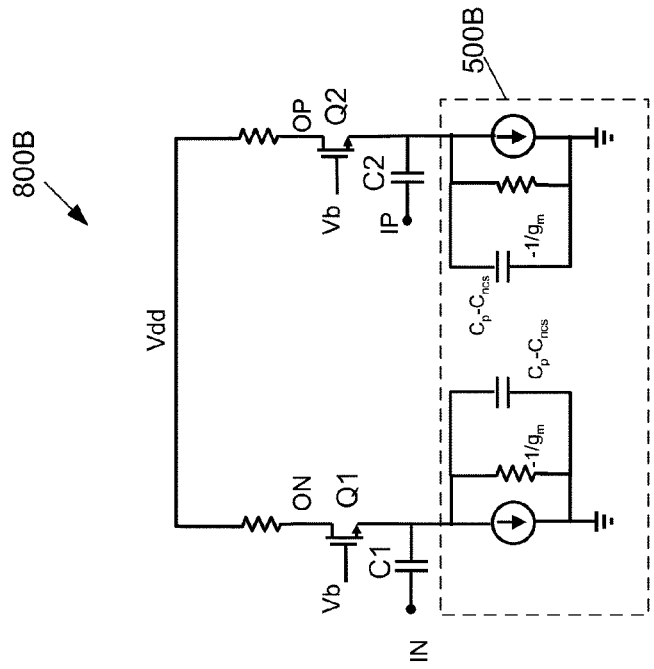
FIG. 8B is a circuit diagram illustrating an example of a common gate amplifier employing the current generator circuit of FIG. 4C.
Figure 8A:
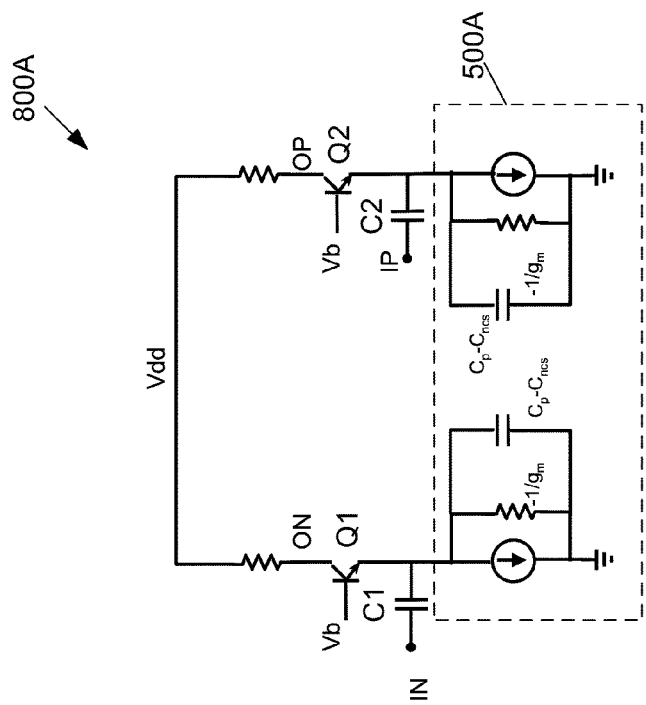
FIG. 8A is a circuit diagram illustrating an example of a common base amplifier employing the current generator circuit of FIG. 4A.

FIG. 8A is a circuit diagram illustrating an example of a common base amplifier 800A employing the current generator circuit 400C of FIG. 4A. In FIG. 8A, instead of the implementation circuit of current generator circuit 400A, for simplicity, the equivalent circuit model 400B is shown. The signal input terminals IN and IP of the common base amplifier 800A are coupled to the emitters of transistors Q1 and Q2 via coupling capacitors C1 and C2, respectively. Common base amplifier 800A benefits from unconditional CM stability and broad operating frequency bandwidth by employing output currents of current generator circuit 400A, which provide unconditional CM stability and broad operating frequency band.

FIG. 8B is a circuit diagram illustrating an example of a common gate amplifier employing the current generator circuit of FIG. 400C. In FIG. 8B, instead of the implementation circuit of current generator circuit 400C, for simplicity, the equivalent circuit model 400D is shown. The signal input terminals IN and IP of the common gate amplifier 800B are coupled to the sources of MOS transistors Q1 and Q2 via coupling capacitors C1 and C2, respectively. Common source amplifier 800A benefits from unconditional CM stability and broad operating frequency bandwidth by employing output currents of current generator circuit 400C, which provide unconditional CM stability and broad operating frequency band.

Figure 9B:
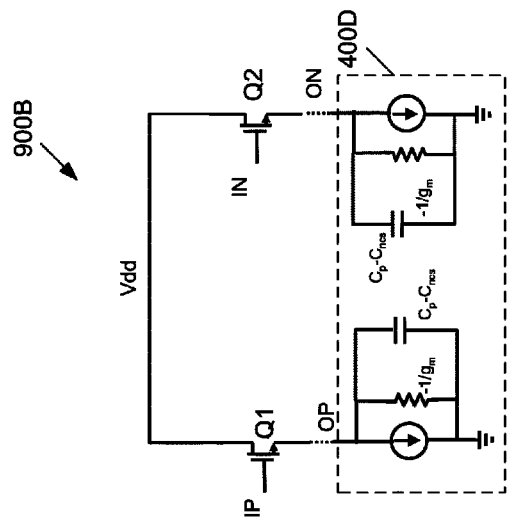
FIG. 9B is a circuit diagram illustrating an example of a source follower amplifier employing the current generator circuit of FIG. 4C.
Figure 9A:
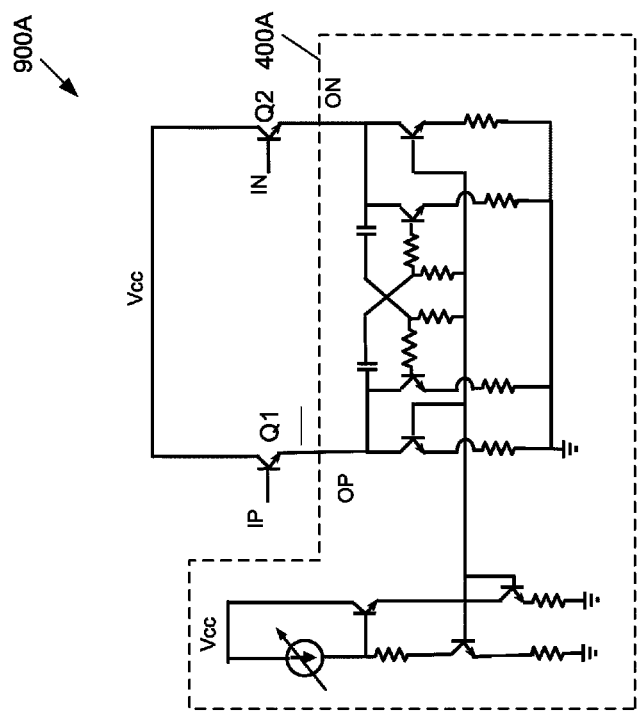
FIG. 9A is a circuit diagram illustrating an example of an emitter follower amplifier employing the current generator circuit of FIG. 4A.

FIG. 9A is a circuit diagram illustrating an example of an emitter follower amplifier 900A employing current generator circuit 400A of FIG. 4A. This is another application of current generator circuit 400A, where the output currents are provided to an emitter follower amplifier formed by bipolar transistors Q1 and Q2. Emitter follower amplifier 900A benefits from unconditional CM stability and broad operating frequency bandwidth by employing output currents of current generator circuit 400A, which provide unconditional CM stability and broad operating frequency band.

FIG. 9B is a circuit diagram illustrating an example of a source follower amplifier 900B employing the current generator circuit of FIG. 4C. This is another application of current generator circuit 400B, where the output currents are provided to an emitter follower amplifier formed by MOS transistors Q1 and Q2. In FIG. 9B, instead of the implementation circuit of current generator circuit 400C, for simplicity, the equivalent circuit model 400D is shown. Source follower amplifier 900B benefits from unconditional CM stability and broad operating frequency bandwidth by employing output currents of current generator circuit 400C, which provide unconditional CM stability and broad operating frequency band.

Figure 10A:
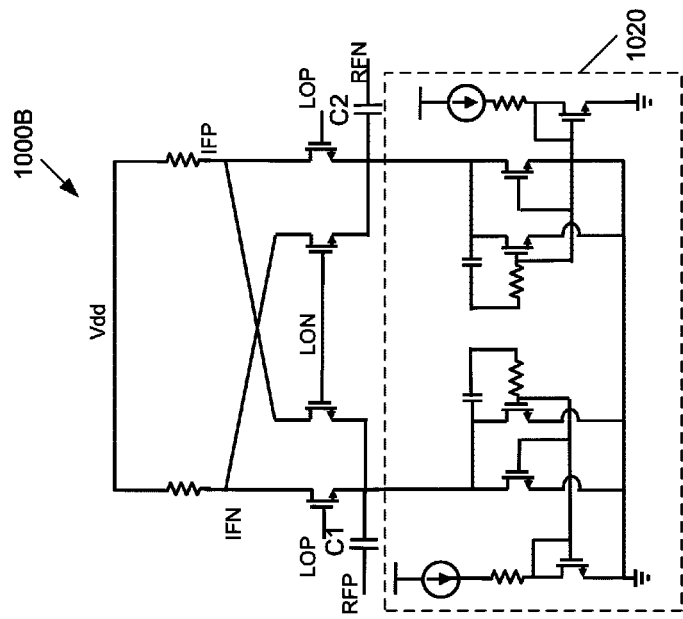
FIG. 10A is a circuit diagram illustrating an example of a common base mixer core circuit employing a current generator circuit with common mode stability and bandwidth broadening.

FIG. 10A is a circuit diagram illustrating an example of a common base mixer core circuit 1000A employing a current generator circuit 1010 with common mode stability and bandwidth broadening. Common base mixer core circuit 1000A shows an application of current source 1010 in a modulator or demodulator circuit. Radio frequency (RF) signals applied through coupling capacitors C1 and C2 to RFP and RFN input terminals of mixer core circuit 1000A are mixed with local oscillator (LO) signals applied to terminals LOP and LON to generate intermediate frequency (IF) signals at IF ports IFP and IFN of mixer core 1000A. Current generator circuit 1010 is substantially equivalent to current generator circuit 400A of FIG. 4A and provides unconditional CM stability and bandwidth broadening to mixer core 1000A.

Figure 10B:
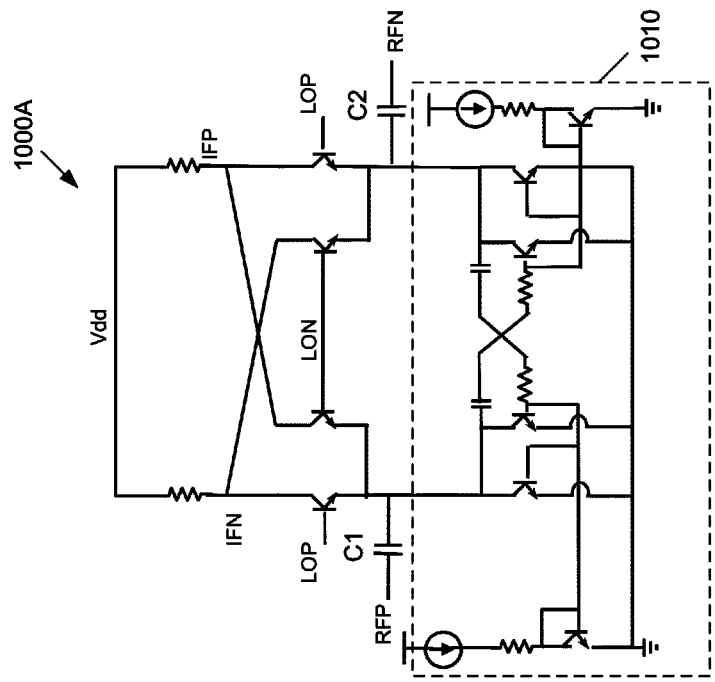
FIG. 10B is a circuit diagram illustrating an example of a common gate mixer core circuit employing a current generator circuit with common mode stability and bandwidth broadening.

FIG. 10B is a circuit diagram illustrating an example of a common gate mixer core 1000B employing a current generator circuit with common mode stability and bandwidth broadening. Common gate mixer core 1000B shows an application of current source 1020 in a MOS modulator or demodulator circuit. Radio frequency (RF) signals applied through coupling capacitors C1 and C2 to RFP and RFN input terminals of mixer core 1000B are mixed with local oscillator (LO) signals applied to terminals LOP and LON to generate intermediate frequency (IF) signals at IF ports IFP and IFN of mixer core 1000B. Current generator circuit 1020 is formed by two single-tail current generator circuits. Each of single-tail current generator circuits is substantially equivalent to current generator circuit 600B of FIG. 6B with slight modification (e.g., having two transistors provide output current instead of one transistor) and provides unconditional CM stability to mixer core 1000A.

Figure 11:
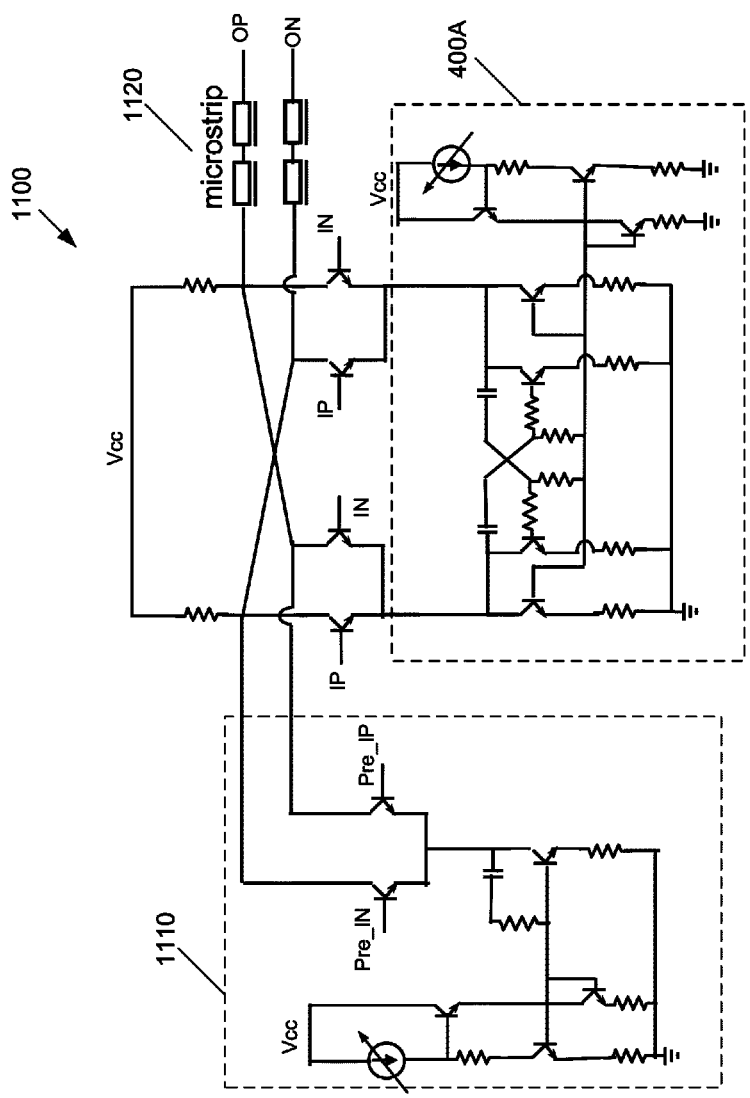
FIG. 11 is a circuit diagram illustrating an example of a line driver amplifier employing the current generator circuit of FIG. 4A.

FIG. 11 is a circuit diagram illustrating an example line driver amplifier 1100 employing the current generator circuit 400A of FIG. 4A. Line driver amplifier 1100 is an amplifier portion of an optical transponder circuit (e.g., a 40 Gbps Optical transponder) including a pre-emphasis circuit 1110. The outputs OP and ON of line driver 1100 are provided through microstrip pads 1120 for impedance matching purposes. The pre-emphasis circuit 1110 helps in providing unconditional CM stability to the outputs of line driver amplifier 1100. The current source used by line driver 1100 is similar to current source 400A of FIG. 4A and provides unconditional CM stability and bandwidth broadening to line driver 1100.

FIG. 12A is a diagram illustrating example Monte Carlo simulation results of a typical line driver amplifier. Eye diagram 1210A and histogram 1220A correspond to a conventional 32 Gbps line driver amplifier, which is similar to line driver amplifier 1100 of FIG. 11 except that it uses a conventional current source instead of current source 400A. Eye diagram 1210A shows a time interval of approximately 2 ns-6 ns. Histogram 1220A showing jitter-peak-to-peak (pp) values in the range of 0-20 ps indicates a worst case jitter-pp value of about 14 ps.

FIG. 12B is a diagram illustrating example Monte Carlo simulation results of the line driver amplifier circuit of FIG. 11. Eye diagram 1210B and jitter-peak-to-peak (pp) histogram 1220B correspond to line driver amplifier 1100 of FIG. 11, which uses a current source 400A which not only provides unconditional CM stability and bandwidth broadening, but also improves eye diagram and signal jitter. Eye diagram 1210A shows a time interval of approximately 2-6 ns, and indicates a drastic improvement over eye diagram 1210A of the conventional line driver. Histogram 1220A showing jitter-peak-to-peak (pp) values in the range of 0-10 ps indicates a worst case jitter-pp value of about 3.8 ps, which considerably improves upon the jitter-pp value of about 14 ps of FIG. 12A. Consequently, using the disclosed current source (e.g., current source 400A) in line driver 1100 significantly improves eye diagram and signal jitter.

Figure 13:
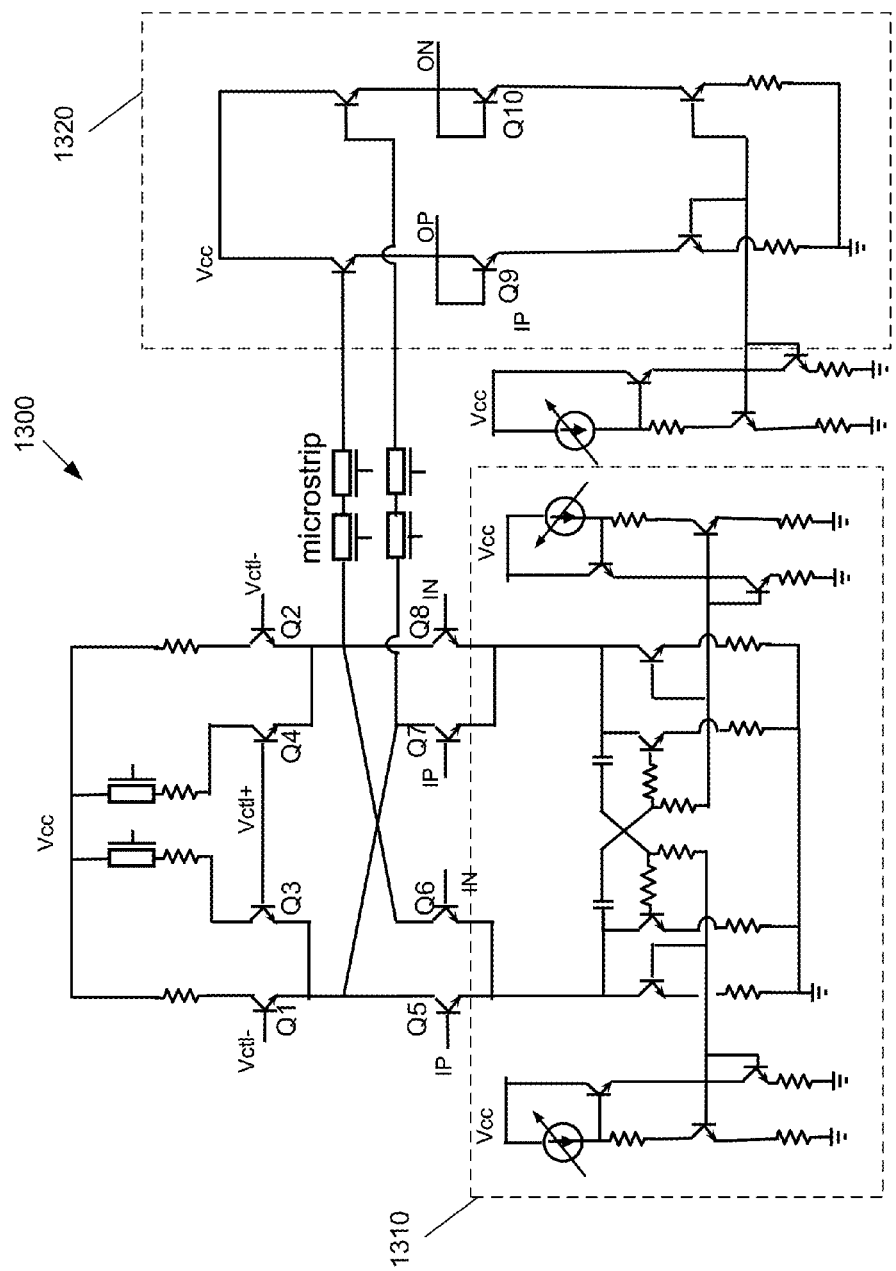
FIG. 13 is a circuit diagram illustrating an example of a broadband single-stage variable gain amplifier (VGA) employing a current generator circuit similar to current generator circuit of FIG. 4A.

FIG. 13 is a circuit diagram illustrating an example broadband single-stage variable gain amplifier (VGA) circuit 1300 employing current generator circuit 1310. VGA circuit 1300 receives input signals at base terminals of transistors Q5, Q6, Q7, and Q8 and provides output signals at base terminals of transistors Q9 and Q10 of output circuit 1320. The variable gain of VGA circuit 1300 is controlled by control signals (e.g., Vctl− and Vctl+) applied to base terminals of transistors Q1 and Q2 (Vctl−) and Q3 and Q4 (Vctl+). VGA circuit 1300 is biased via current source 1310. Current source 1310 is substantially similar to current source 400A of FIG. 4A, and provides for unconditional CM stability and bandwidth broadening of VGA circuit 1300.

Figure 14A:
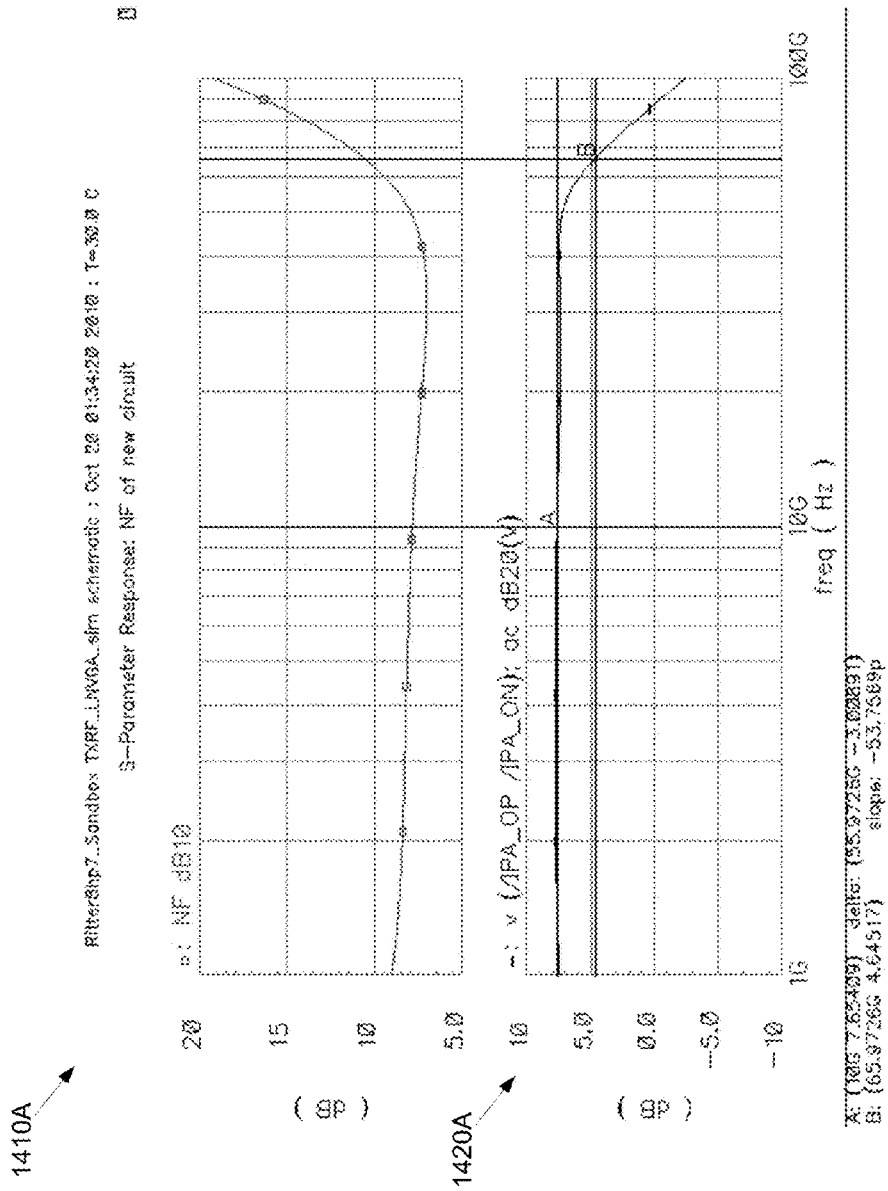
FIG. 14A illustrates an example of a noise figure diagram and a gain diagram of the VGA of FIG. 13.

FIG. 14A illustrates example noise figure (NF) diagram 1410A and gain diagram 1420A of the VGA 1300 of FIG. 13. NF diagram 1410A and gain diagram 1420A are measured for a specific value of control voltage (e.g., a magnitude of 0.1V of Vctl+ and Vctl− signals of FIG. 13). NF diagram 1410A shows a value for NF of approximately 7-8 dB in the operating frequency range (e.g., of approximately 1-65 GHz), which indicates a significant improvement over NF of conventional VGA circuits with comparable bandwidth. Gain diagram 1420A indicates a bandwidth (e.g., corresponding to a 3 dB point B) of approximately 66 GHz at a gain of approximately 5 dB, which shows an approximate improvement of gain-bandwidth-product (GBP) of 8 dB over the value of GBP for a conventional VGA circuit.

Figure 14B:
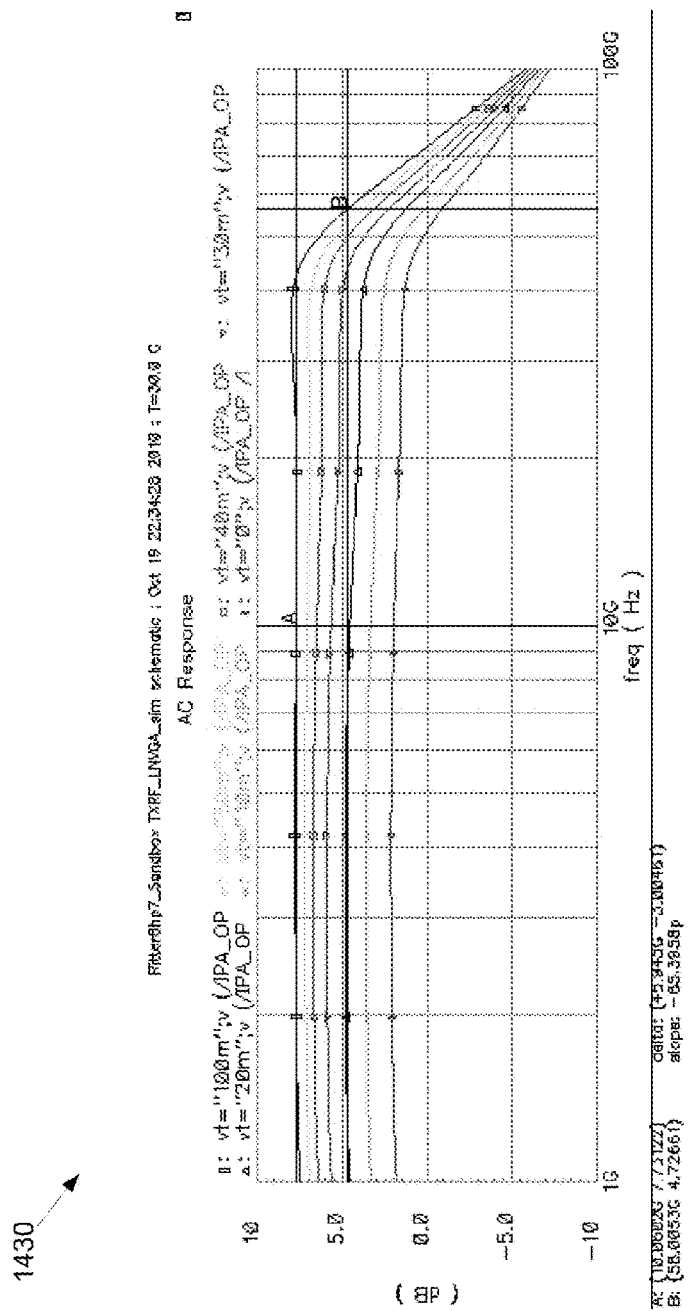
FIG. 14B is a diagram illustrating an example gain control response of the VGA of FIG. 13.

FIG. 14B is a diagram illustrating an example gain control response 1430 of the VGA 1300 of FIG. 13. Gain control response 1430 shows a number of diagrams each corresponding to a specific value of control voltage (e.g., a magnitude of 0, for bottom diagram, to a magnitude of 0.1V, for the top diagram, corresponding to Vctl+ and Vctl− signals of FIG.

13). An interesting feature of gain control response 1430 is that the linearity of VGA 1300 is not affected by higher gain values of the VGA 1300.

Figure 14C:
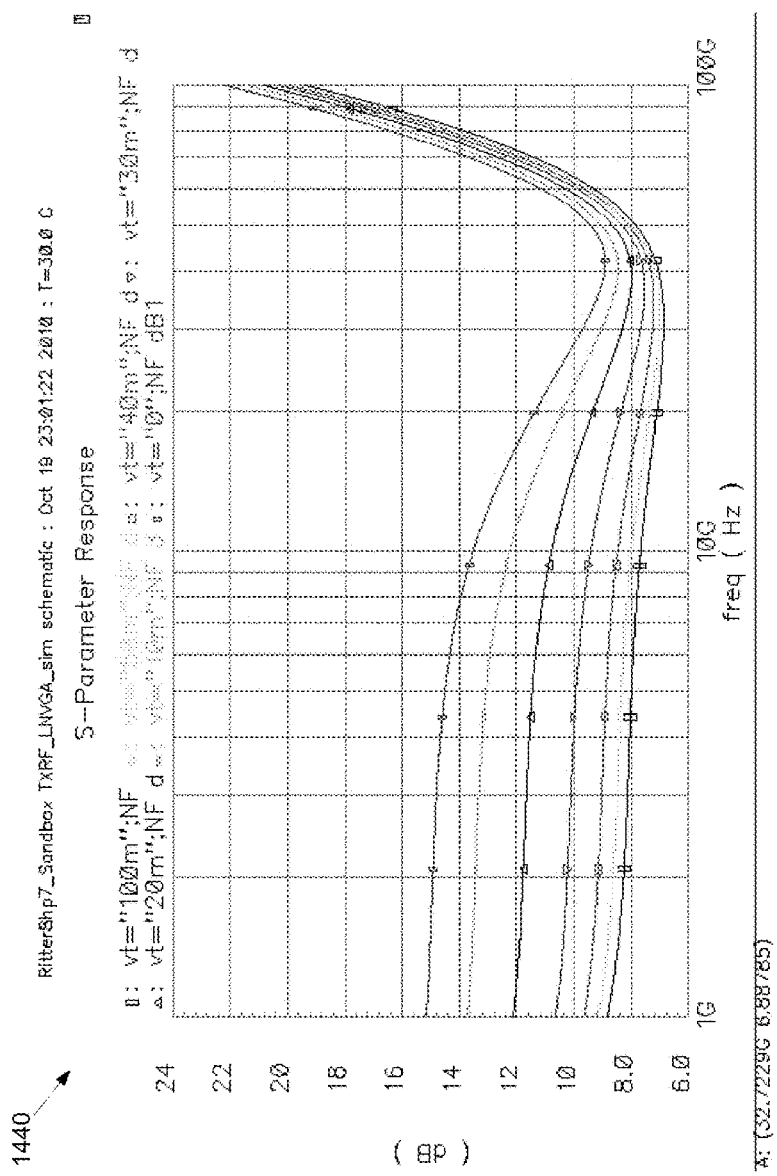
FIG. 14C is a diagram illustrating example NF diagrams of the VGA of FIG. 13 with gain adjustments.

FIG. 14C is a diagram illustrating example NF diagrams 1440 of VGA 1300 of FIG. 13 with gain adjustments. NF diagrams 1440 show a number of diagrams each corresponding to a specific value of the control voltage (e.g., a magnitude of 0, for top diagram, to a magnitude of 0.1V, for the bottom diagram, corresponding to Vctl+ and Vctl− signals of FIG. 13). An interesting feature of NF diagrams 1440 is that the NF of VGA 1300 is reduced at higher gain values of the VGA 1300.

Figures 14D, 14E:
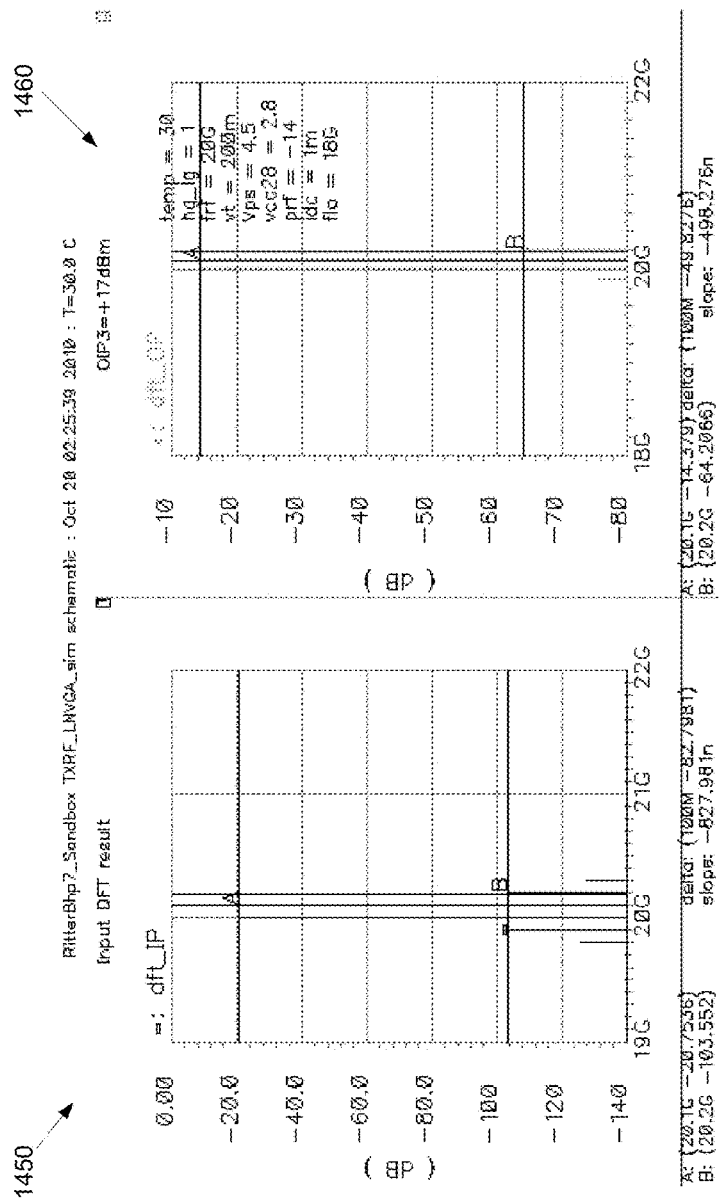
FIG. 14D is a diagram illustrating an example input Discrete Fourier Transform (DFT) of the VGA of FIG. 13 at a high gain.
FIG. 14E is a diagram illustrating an example 3rd-order output inter-modulation product OIP3 of the VGA of FIG. 13 at a high gain.

FIG. 14D is a diagram illustrating an example input Discrete Fourier Transform (DFT) 1450 of the VGA 1300 of FIG. 13 at a high gain value. Input DFT diagram 1450 corresponds to an input signal applied to VGA 1300 and shows a first sine tone (e.g., component A at 20.1 GHz) that is approximately 83 dB stronger than a second sine tone (e.g., component B at 20.2 GHz).

FIG. 14E is a diagram illustrating an example 3rd-order output inter-modulation product (OIP3) 1460 of the VGA 1300 of FIG. 13 at a high gain value. OIP3 diagram 1460 corresponds to the output signal of VGA 1300 produced in response to applying an input signal having the first and the second sine tones shown in DFT diagram 1450 of FIG. 14D and a high gain value. OIP3 diagram 1460 shows that at the output the amplified first sine tone (at 20.1 GHz) is about 50 dB stronger than the amplified second tone (at 20.2 GHz). This shows a change of about 33 dB (i.e., 83 dB−50 dB) with respect to the input signal.

Figures 14F, 14G:
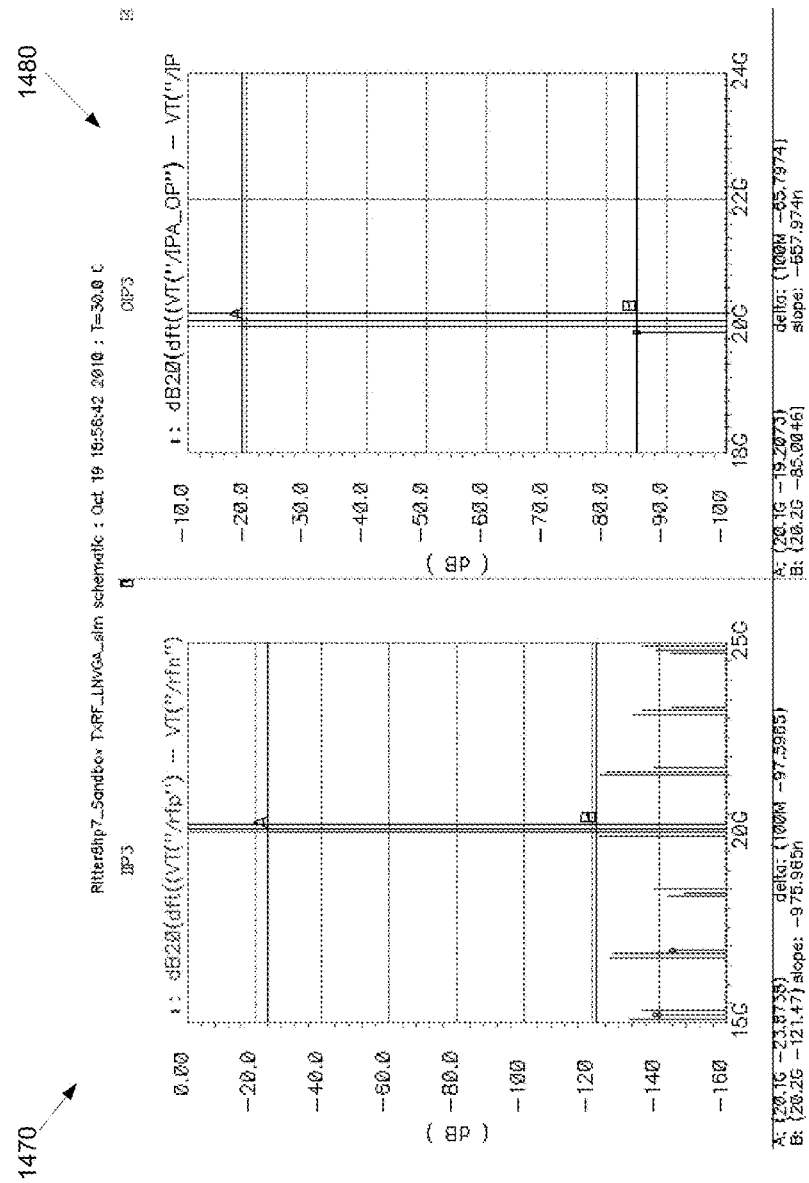
FIG. 14F is a diagram illustrating an example input Discrete Fourier Transform (DFT) of the VGA of FIG. 13 at a medium gain.
FIG. 14G is a diagram illustrating an example 3rd-order output inter-modulation product OIP3 of the VGA of FIG. 13 at a medium gain.

FIG. 14F is a diagram illustrating an example input Discrete Fourier Transform (DFT) 1470 of the VGA 1300 of FIG. 13 at a medium gain value. Input DFT diagram 1470 corresponds to an input signal applied to VGA 1300 and shows a first sine tone (e.g., component A at 20.1 GHz) that is approximately 98 dB stronger than a second sine tone (e.g., component B at 20.2 GHz).

FIG. 14G is a diagram illustrating an example 3rd-order output inter-modulation product IP3 of the VGA 1300 of FIG. 13 at a medium gain value. OIP3 diagram 1480 corresponds to the output signal of VGA 1300 produced in response to applying an input signal having first and second sine tones shown in DFT diagram 1470 of FIG. 14F and a medium gain value. OIP3 diagram 1480 shows that the first sine tone (at 20.1 GHz) is about 66 dB stronger than the second sine tone (at 20.2 GHz). This shows a change of about 32 dB (i.e., 98−66=32 dB) with respect to the input signal, which is very close to the value of 33 dB found with respect to FIG. 14 E). This observation indicates that changing the gain from a high value (corresponding to FIGS. 14D and 14E) to a medium value (corresponding to FIGS. 14F and 14G) has minor effect on linearity of the VGA circuit 1300, which a desirable feature afforded by the disclosed current source.

Figure 15:
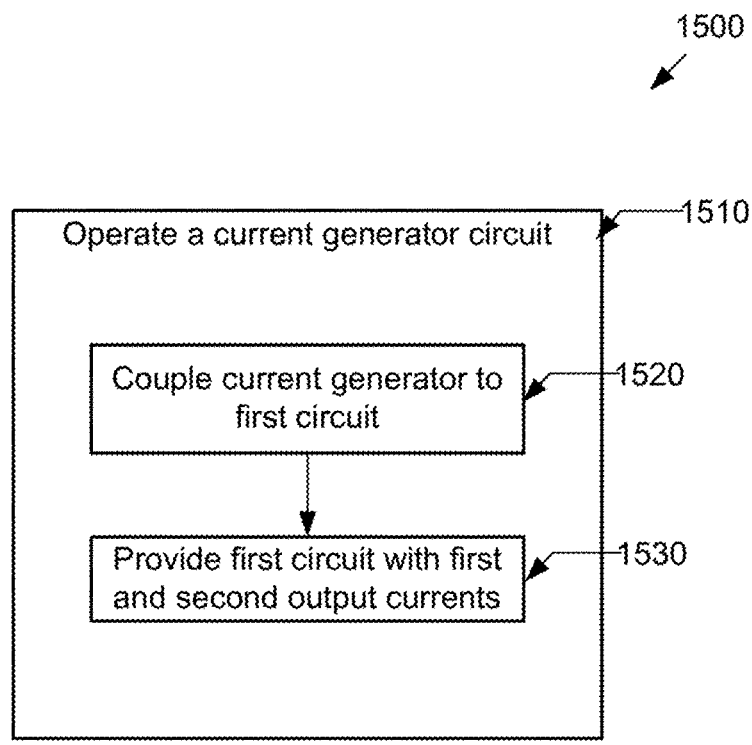
FIG. 15 is a flow diagram illustrating an example of a method of operation of a current generator circuit to provide current to another circuit.

FIG. 15 is a flow diagram illustrating an example of method 1500 of an operation of a current generator circuit to provide current to another circuit. A current generator circuit (e.g., current generator circuit 400A of FIG. 4A) may be operated (1510) by coupling the current generator circuit to a first circuit (e.g., any of a common emitter/source amplifier of FIGS. 7A-B, common base/gate amplifiers of FIGS. 8A-B, mixer core of FIGS. 10A-B, line driver of FIG. 11, or VGA circuit 1300 of FIG. 13) (1520) to provide the first circuit with a first current $I_{out1}$ and a second current $I_{out2}$ (1530). Providing the first current $I_{out1}$ and the second current $I_{out2}$ to the first circuit may afford unconditionally stability and bandwidth broadening to the first circuit as shown above with respect to, for example, FIGS. 3A-B.

Illustration of Subject Technology as Clauses

Various examples of aspects of the disclosure are described as numbered clauses (1, 2, 3, etc.) for convenience. These are provided as examples, and do not limit the subject technology. Identifications of the figures and reference numbers are provided below merely as examples and for illustrative purposes, and the clauses are not limited by those identifications.

1. A current generator circuit (e.g., 200 of FIG. 2) to provide a first output current and a second output current (e.g., $I_{out1}$ and $I_{out2}$ of FIG. 2), comprising:
    a first transistor including a first, second, and third terminal, the first transistor configured to provide the first output current at the third terminal of the first transistor (e.g., Q3 of FIG. 2);
    a second transistor including a first, second, and third terminal, the first transistor configured to provide the second output current at the third terminal of the second transistor (e.g., Q4 of FIG. 2);
    a first branch including a first resistor (e.g., R1 of FIG. 2) and a first capacitor (e.g., C1 of FIG. 2) coupled in series, the first branch coupled between the third terminal of the first transistor and the first terminal of the second transistor; and
    a second branch including a second resistor (e.g., R2 of FIG. 2) and a second capacitor (e.g., C2 of FIG. 2) coupled in series, the second branch coupled between the third terminal of the second transistor and the first terminal of the first transistor,
    wherein the first and the second branches are configured to enable the current generator circuit to provide the first and second currents with an improved common mode stability (e.g., 304 of FIG. 3A).

2. The current generator circuit of clause 1, wherein the first and the second transistors comprise bipolar transistors (e.g., Q3 and Q4 of FIG. 2), and wherein the first, second, and third terminals of the first transistor comprise a base, an emitter, and a collector of the first transistor, respectively, and the first, second, and third terminals of the second transistor comprise a base, an emitter, and a collector of the second transistor, respectively.

3. The current generator circuit of clause 1, wherein the first and the second transistors comprise MOS transistors (e.g., Q3 and Q4 of FIG. 4C), and wherein the first, second, and third terminals of the first transistor comprise a gate, a source, and a drain of the first transistor, respectively, and the first, second, and third terminals of the second transistor comprise a gate, a source, and a drain of the second transistor, respectively.

4. The current generator circuit of clause 1, wherein the first resistor and the first capacitor are substantially the same as the second resistor and the second capacitor, respectively.

5. The current generator circuit of clause 1, wherein the first and the second branches are configured to enable the current generator to provide the first and second output currents with improved operating frequency response.

6. The current generator circuit of clause 1, wherein the first and the second capacitors are configured to counter capacitances seen from the third terminals of the first and the second transistors ($C_{pcs}$ and $-C_{ncs}$ of FIGS. 4B and 4D)

7. The current generator circuit of clause 1, further comprising a first current source (e.g., 230 of FIG. 2), wherein the first current source is coupled to the second terminals of the first and the second transistors.

8. The current generator circuit of clause 7, wherein the first current source comprises at least one of a differential emitter follower circuit (e.g., 230 of FIG. 2) and a differential source follower circuit.

9. The current generator circuit of clause 8, wherein the emitter follower circuit and the source follower circuit are biased via a second current source (e.g., 220 of FIG. 2), and wherein the second current source is biased via a bandgap voltage reference (e.g., 122 of FIG. 4A).

10. The current generator circuit of clause 1, further comprising an output circuit, wherein the output circuit includes at least one of a differential emitter follower and a differential source follower (e.g., 700A-B of FIG. 4A-B).

11. The current generator circuit of clause 1, wherein the second terminals of the first and the second transistors are coupled to a ground potential (e.g., 400A and 400C of FIG. 4A and 400C).

12. The current generator circuit of clause 1, wherein the current generator circuit is configured to provide the first and the second output currents to at least one of a common source amplifier circuit and a common emitter amplifier circuit (e.g., 700A-B of FIGS. 7A-B), and wherein the current generator circuit is further configured to at least improve a corresponding frequency response of the at least one of the common source amplifier circuit and the common emitter amplifier circuits (e.g., 122 of FIG. 4A).

13. The current generator circuit of clause 1, wherein the current generator circuit is configured to provide the first and the second output currents to at least one of a source follower circuit and an emitter follower circuit (e.g., 900A-B of FIGS. 9A-B).

14. The current generator circuit of clause 1, wherein the current generator circuit is configured to provide the first and the second output currents to at least one of a gate-mixer core circuit and a base-mixer core circuit (e.g., 1000A-B of FIGS. 10A-B) and wherein the current generator circuit is further configured to at least improve a corresponding frequency response of the at least one of the gate-mixer core circuit and the base-mixer core circuit.

15. The current generator circuit of clause 1, wherein the current generator circuit is configured to provide the first and the second output currents to a line driver amplifier circuit (e.g., 1100 of FIG. 11), and wherein the current generator circuit is further configured to improve at least one of eye diagram performance (e.g., 1210B of FIG. 12B) or jitter (e.g., 1220A of FIG. 12B) of the line driver amplifier circuit.

16. The current generator circuit of clause 1, wherein the current generator circuit is configured to provide the first and the second output currents to a variable gain amplifier (VGA) core circuit (e.g., 1300 of FIG. 13), and wherein the current generator circuit is further configured to improve at least one of a frequency response or linearity characteristics of the VGA core circuit (e.g., 1410A. 1420A of FIG. 14A, 1430 of FIG. 14B, 1440 of FIG. 14C, 1460 of FIG. 14E, and 1480 of FIG. 14G).

17. A current generator circuit (e.g., 600A-B of FIGS. 6A-B) to provide an output current ($I_{out}$ of FIGS. 6A-B), comprising:
a transistor including a first, second, and third terminal, the transistor configured to provide the output current at the third terminal (e.g., Q of FIGS. 6A-B); and
a branch including a resistor (e.g., R of FIGS. 6A-B) and a capacitor (e.g., C of FIGS. 6A-B) coupled in series, the branch coupled between the first terminal and the third terminal of the transistor,
wherein the second terminal is coupled to a ground potential and the first terminal is coupled to a stable voltage source (220 of FIGS. 6A-B), and wherein the branch is configured to enable the current generator circuit to provide the output current with an improved common mode stability and frequency response.

18. A method of operating a current generator circuit (e.g., 500A of FIG. 2), comprising:
coupling the current generator circuit to a first circuit (e.g., 700A of FIG. 7A);
providing, to the first circuit, a first output current and a second output current (e.g., $I_{out1}$ and $I_{out2}$ of FIG. 2), wherein the current generator circuit includes:
a first transistor including a first, second, and third terminal, the first transistor configured to provide the first output current at the third terminal of the first transistor, which comprises one of an output terminal of an output terminal pair of the current generator circuit (e.g., Q3 of FIG. 2);
a second transistor including a corresponding first, second, and third terminal, the second transistor configured to provide the second output current at the third terminal of the second transistor, which comprises another output terminal of the output terminal pair of the current generator circuit (e.g., Q4 of FIG. 2);
a first branch including a first resistor (e.g., R1 of FIG. 2) and a first capacitor (e.g., C1 of FIG. 2) coupled in series, the first branch coupled between the third terminal of the first transistor and the first terminal of the second transistor; and
a second branch including a second resistor (e.g., R2 of FIG. 2) and a second capacitor (e.g., C2 of FIG. 2) coupled in series, the second branch coupled between the third terminal of the second transistor and the first terminal of the first transistor,
wherein the first and the second branches are configured to enable the current generator circuit to provide the first and second current sources with an improved common mode stability (e.g., 304 of FIG. 3A).

19. The method of clause 18, wherein coupling the current generator circuit to the first circuit comprises coupling the output terminal pair of the current generator circuit to input terminals of the first circuit, the first circuit including at least one of a common source and a common emitter amplifier circuits (e.g., 700A-B of FIGS. 7A-B), and wherein coupling the current generator circuit at least improves a corresponding frequency response of the common source or the common emitter amplifier circuits (e.g., 122 of FIG. 4A).

20. The method of clause 18, wherein coupling the current generator circuit to the first circuit comprises coupling the output terminal pair of the current generator circuit to input terminals of the first circuit, the first circuit including at least one of a gate-mixer core circuit and a base-mixer core circuit (e.g., 1000A-B of FIGS. 10A-B), and wherein coupling the current generator circuit at least improves a corresponding frequency response of the gate-mixer core circuit or the base-mixer core circuit.

21. The method of clause 18, wherein coupling the current generator circuit to the first circuit comprises coupling the output terminal pair of the current generator circuit to input terminals of the first circuit, the first circuit including a line driver amplifier circuit (e.g., 1100 of FIG. 11), and wherein the coupling current generator circuit improves at least one of eye diagram performance (e.g., 1210B of FIG. 12B) or jitter (e.g., 1220A of FIG. 12B) of the line driver amplifier circuit.

22. The method of clause 18, wherein coupling the current generator circuit to the first circuit comprises coupling the output terminal pair of the current generator circuit to input terminals of the first circuit, the first circuit including a variable gain amplifier (VGA) core circuit (e.g., 1300 of FIG. 13), and wherein the coupling current generator circuit improves at least one of a frequency response or linearity characteristics of the VGA core circuit (e.g., 1410A. 1420A of FIG. 14A, 1430 of FIG. 14B, 1440 of FIG. 14C, 1460 of FIG. 14E, and 1480 of FIG. 14G).

Other Remarks

In one aspect, any of the clauses herein may depend from any one of the independent clauses or any one of the dependent clauses. In one aspect, any of the clauses (e.g., dependent or independent clauses) may be combined with any other clauses (e.g., dependent or independent clauses). In one aspect, a claim may include some or all of the words (e.g., steps, operations, means or components) recited in a clause, a sentence, a phrase or a paragraph. In one aspect, a claim may include some or all of the words recited in one or more clauses, sentences, phrases or paragraphs. In one aspect, some of the words in each of the clauses, sentences, phrases or paragraphs may be removed. In one aspect, additional words or elements may be added to a clause, a sentence, a phrase or a paragraph. In one aspect, the subject technology may be implemented without utilizing some of the components, elements, functions or operations described herein. In one aspect, the subject technology may be implemented utilizing additional components, elements, functions or operations.

In one aspect, any methods, instructions, code, means, logic, components, blocks, modules and the like (e.g., software or hardware) described or claimed herein can be represented in drawings (e.g., flow charts, block diagrams), such drawings (regardless of whether explicitly shown or not) are expressly incorporated herein by reference, and such drawings (if not yet explicitly shown) can be added to the disclosure without constituting new matter. For brevity, some (but not necessarily all) of the clauses/descriptions/claims are explicitly represented in drawings, but any of the clauses/descriptions/claims can be represented in drawings in a manner similar to those drawings explicitly shown. For example, a flow chart can be drawn for any of the clauses, sentences or claims for a method such that each operation or step is connected to the next operation or step by an arrow. In another example, a block diagram can be drawn for any of the clauses, sentences or claims having means-for elements (e.g., means for performing an action) such that each means-for element can be represented as a module for element (e.g., a module for performing an action).

Those of skill in the art would appreciate that items such as the various illustrative blocks, modules, elements, components, methods, operations, steps, and algorithms described herein may be implemented as hardware or a combination of hardware and software.

To illustrate the interchangeability of hardware and software, items such as the various illustrative blocks, modules, elements, components, methods, operations, steps, and algorithms have been described generally in terms of their functionality. Whether such functionality is implemented as hardware or software depends upon the particular application and design constraints imposed on the overall system. Skilled artisans may implement the described functionality in varying ways for each particular application.

In one aspect, "means," a block, a module, an element, a component or a processor may be an item (e.g., one or more of blocks, modules, elements, components or processors) for performing one or more functions or operations. In one aspect, such an item may be an apparatus, hardware, or a portion thereof. In an example, an item may be implemented as one or more circuits configured to perform the function(s) or operation(s). A circuit may include one or more circuits and/or logic. A circuit may be analog and/or digital. A circuit may be electrical and/or optical. A circuit may include transistors. In an example, one or more items may be implemented as a processing system (e.g., a digital signal processor (DSP), an application specific integrated circuit (ASIC), a field programmable gate array (FPGA), etc.). In one example, an item may also include a structure in the form of, for example, an instruction(s) for performing the function(s) or operation(s), where the instruction(s) are encoded or stored on a machine-readable medium, on another device, or on a portion thereof, where an instruction(s) may be software, an application(s), a subroutine(s), or a portion thereof. Those skilled in the art will recognize how to implement the instructions, circuits, and processing systems.

A reference to an element in the singular is not intended to mean "one and only one" unless specifically so stated, but rather "one or more." For example, a clock signal may refer to one or more clock signals, a control signal may refer to one or more control signals, an input signal may refer to one or more input signals, an output signal may refer to one or more output signals, and a signal may refer to differential voltage signals.

Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the invention.

The word "exemplary" is used herein to mean "serving as an example or illustration." Any aspect or design described herein as "exemplary" is not necessarily to be construed as preferred or advantageous over other aspects or designs. In one aspect, various alternative configurations and operations described herein may be considered to be at least equivalent.

A phrase such as an "aspect" does not imply that such aspect is essential to the subject technology or that such aspect applies to all configurations of the subject technology. A disclosure relating to an aspect may apply to all configurations, or one or more configurations. An aspect may provide one or more examples. A phrase such as an aspect may refer to one or more aspects and vice versa. A phrase such as an "embodiment" does not imply that such embodiment is essential to the subject technology or that such embodiment applies to all configurations of the subject technology. A disclosure relating to an embodiment may apply to all embodiments, or one or more embodiments. An embodiment may provide one or more examples. A phrase such an embodiment may refer to one or more embodiments and vice versa. A phrase such as a "configuration" does not imply that such configuration is essential to the subject technology or that such configuration applies to all configurations of the subject technology. A disclosure relating to a configuration may apply to all configurations, or one or more configurations. A configuration may provide one or more examples. A phrase such a configuration may refer to one or more configurations and vice versa.

In one aspect of the disclosure, when actions or functions are described as being performed by an item (e.g., receiving, determining, providing, generating, converting, displaying, notifying, accepting, selecting, controlling, transmitting, reporting, sending, or any other action or function), it is understood that such actions or functions may be performed by the item directly or indirectly. In one aspect, when a module is described as performing an action, the module may be understood to perform the action directly. In one aspect, when a module is described as performing an action, the module may be understood to perform the action indirectly, for example, by facilitating, enabling or causing such an action.

In one aspect, unless otherwise stated, all measurements, values, ratings, positions, magnitudes, sizes, and other specifications that are set forth in this specification, including in the claims that follow, are approximate, not exact. In one aspect, they are intended to have a reasonable range that is consistent with the functions to which they relate and with what is customary in the art to which they pertain.

In one aspect, the term "coupled" or the like may refer to being directly coupled. In another aspect, the term "coupled" or the like may refer to being indirectly coupled.

Terms such as "top," "bottom," "front," "rear" and the like as used in this disclosure should be understood as referring to an arbitrary frame of reference, rather than to the ordinary gravitational frame of reference. Thus, a top surface, a bottom surface, a front surface, and a rear surface may extend upwardly, downwardly, diagonally, or horizontally in a gravitational frame of reference.

Various items may be arranged differently (e.g., arranged in a different order, or partitioned in a different way) all without departing from the scope of the subject technology. In one aspect of the disclosure, the elements recited in the accompanying claims may be performed by one or more modules or sub-modules.

It is understood that the specific order or hierarchy of steps, operations or processes disclosed is an illustration of exemplary approaches. Based upon design preferences, it is understood that the specific order or hierarchy of steps, operations or processes may be rearranged. Some of the steps, operations or processes may be performed simultaneously. Some or all of the steps, operations, or processes may be performed automatically, without the intervention of a user. The accompanying method claims, if any, present elements of the various steps, operations or processes in a sample order, and are not meant to be limited to the specific order or hierarchy presented.

The disclosure is provided to enable any person skilled in the art to practice the various aspects described herein. The disclosure provides various examples of the subject technology, and the subject technology is not limited to these examples. Various modifications to these aspects will be readily apparent to those skilled in the art, and the generic principles defined herein may be applied to other aspects.

In one aspect, a transistor may refer to a bipolar junction transistor, a field effect transistor, or the like. In one aspect, capacitors and resistors may be implemented using transistor or diode elements. In some figures or their corresponding descriptions, exemplary values of some parameters, such as gain, bandwidth, OIP3, and the like are given. The subject technology, however, is not limited to these exemplary numbers, and can be implemented with other numbers of bits or components.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112, sixth paragraph, unless the element is expressly recited using the phrase "means for" or, in the case of a method claim, the element is recited using the phrase "step for." Furthermore, to the extent that the term "include," "have," or the like is used, such term is intended to be inclusive in a manner similar to the term "comprise" as "comprise" is interpreted when employed as a transitional word in a claim.

The Title, Background, Summary, Brief Description of the Drawings and Abstract of the disclosure are hereby incorporated into the disclosure and are provided as illustrative examples of the disclosure, not as restrictive descriptions. It is submitted with the understanding that they will not be used to limit the scope or meaning of the claims. In addition, in the Detailed Description, it can be seen that the description provides illustrative examples and the various features are grouped together in various embodiments for the purpose of streamlining the disclosure. This method of disclosure is not to be interpreted as reflecting an intention that the claimed subject matter requires more features than are expressly recited in each claim. Rather, as the following claims reflect, inventive subject matter lies in less than all features of a single disclosed configuration or operation. The following claims are hereby incorporated into the Detailed Description, with each claim standing on its own as a separately claimed subject matter.

The claims are not intended to be limited to the aspects described herein, but are to be accorded the full scope consistent with the language claims and to encompass all legal equivalents. Notwithstanding, none of the claims are intended to embrace subject matter that fails to satisfy the requirement of 35 U.S.C. §101, 102, or 103, nor should they be interpreted in such a way. Any unintended embracement of such subject matter is hereby disclaimed.

What is claimed is:

1. A current generator circuit to provide a first output current and a second output current comprising:
    a first transistor including a first, second, and third terminal, the first transistor configured to provide the first output current at the third terminal of the first transistor;
    a second transistor including a first, second, and third terminal, the second transistor configured to provide the second output current at the third terminal of the second transistor;
    a first branch including a first resistor and a first capacitor coupled in series, the first branch coupled between the third terminal of the first transistor and the first terminal of the second transistor; and
    a second branch including a second resistor and a second capacitor coupled in series, the second branch coupled between the third terminal of the second transistor and the first terminal of the first transistor,
    wherein the first and the second branches are configured to enable the current generator circuit to provide the first and second output currents with an improved common mode stability including an associated common mode stability factor that is greater than one over a substantially wide frequency range.

2. The current generator circuit of claim 1, wherein the first and the second transistors comprise bipolar transistors, and wherein the first, second, and third terminals of the first transistor comprise a base, an emitter, and a collector of the first transistor, respectively, and the first, second, and third terminals of the second transistor comprise a base, an emitter, and a collector of the second transistor, respectively.

3. The current generator circuit of claim 1, wherein the first and the second transistors comprise MOS transistors, and wherein the first, second, and third terminals of the first transistor comprise a gate, a source, and a drain of the first transistor, respectively, and the first, second, and third terminals of the second transistor comprise a gate, a source, and a drain of the second transistor, respectively.

4. The current generator circuit of claim 1, wherein the first resistor and the first capacitor are substantially the same as the second resistor and the second capacitor, respectively.

5. The current generator circuit of claim 1, wherein the first and the second branches are configured to enable the current generator to provide the first and second output currents with improved operating frequency response.

6. The current generator circuit of claim 1, wherein the first and the second capacitors are configured to counter capacitances seen from the third terminals of the first and the second transistors.

7. The current generator circuit of claim 1, further comprising a first current source, wherein the first current source is coupled to the second terminals of the first and the second transistors.

8. The current generator circuit of claim 7, wherein the first current source comprises at least one of a differential emitter follower circuit and a differential source follower circuit.

9. The current generator circuit of claim 8, wherein the emitter follower circuit and the source follower circuit are biased via a second current source, and wherein the second current source is biased via a bandgap voltage reference.

10. The current generator circuit of claim 1, further comprising an output circuit, wherein the output circuit includes at least one of a differential emitter follower and a differential source follower.

11. The current generator circuit of claim 1, wherein the second terminals of the first and the second transistors are coupled to a ground potential.

12. The current generator circuit of claim 1, wherein the current generator circuit is configured to provide the first and the second output currents to at least one of a common source amplifier circuit and a common emitter amplifier circuit, and wherein the current generator circuit is further configured to at least improve a corresponding frequency response of the at least one of the common source amplifier circuit and the common emitter amplifier circuits.

13. The current generator circuit of claim 1, wherein the current generator circuit is configured to provide the first and the second output currents to at least one of a source follower circuit and an emitter follower circuit.

14. The current generator circuit of claim 1, wherein the current generator circuit is configured to provide the first and the second output currents to at least one of a gate-mixer core circuit and a base-mixer core circuit and wherein the current generator circuit is further configured to at least improve a corresponding frequency response of the at least one of the gate-mixer core circuit and the base-mixer core circuit.

15. The current generator circuit of claim 1, wherein the current generator circuit is configured to provide the first and the second output currents to a line driver amplifier circuit and wherein the current generator circuit is further configured to improve at least one of eye diagram performance or jitter of the line driver amplifier circuit.

16. The current generator circuit of claim 1, wherein the current generator circuit is configured to provide the first and the second output currents to a variable gain amplifier (VGA) core circuit, and wherein the current generator circuit is further configured to improve at least one of a frequency response or linearity characteristics of the VGA core circuit.

17. A current generator circuit to provide an output current, comprising:
a transistor including a first, second, and third terminal, the transistor configured to provide the output current at the third terminal; and
a branch including a resistor and a capacitor coupled in series, the branch coupled between the first terminal and the third terminal of the transistor,
wherein the second terminal is coupled to a ground potential and the first terminal is coupled to a stable voltage source, and
wherein the branch is configured to enable the current generator circuit to provide the output current with an improved common mode stability including an associated common mode stability factor that is greater than one over a substantially wide frequency range.

18. A method of operating a current generator circuit comprising:
coupling the current generator circuit to a first circuit;
providing, to the first circuit, a first output current and a second output current,
wherein the current generator circuit includes:
a first transistor including a first, second, and third terminal, the first transistor configured to provide the first output current at the third terminal of the first transistor, which comprises one of an output terminal of an output terminal pair of the current generator circuit;
a second transistor including a corresponding first, second, and third terminal, the second transistor configured to provide the second output current at the third terminal of the second transistor, which comprises another output terminal of the output terminal pair of the current generator circuit;
a first branch including a first resistor and a first capacitor coupled in series, the first branch coupled between the third terminal of the first transistor and the first terminal of the second transistor; and
a second branch including a second resistor and a second capacitor coupled in series, the second branch coupled between the third terminal of the second transistor and the first terminal of the first transistor,
wherein the first and the second branches are configured to enable the current generator circuit to provide the first and second current sources with an improved common mode stability including an associated common mode stability factor that is greater than one over a substantially wide frequency range.

19. The method of claim 18, wherein coupling the current generator circuit to the first circuit comprises coupling the output terminal pair of the current generator circuit to input terminals of the first circuit, the first circuit including at least one of a common source and a common emitter amplifier circuits, and wherein coupling the current generator circuit at least improves a corresponding frequency response of the common source or the common emitter amplifier circuits.

20. The method of claim 18, wherein coupling the current generator circuit to the first circuit comprises coupling the output terminal pair of the current generator circuit to input terminals of the first circuit, the first circuit including at least one of a gate-mixer core circuit and a base-mixer core circuit, and wherein coupling the current generator circuit at least improves a corresponding frequency response of the gate-mixer core circuit or the base-mixer core circuit.

21. The method of claim 18, wherein coupling the current generator circuit to the first circuit comprises coupling the output terminal pair of the current generator circuit to input terminals of the first circuit, the first circuit including a line driver amplifier circuit, and wherein the coupling current generator circuit improves at least one of eye diagram performance or jitter of the line driver amplifier circuit.

22. The method of claim 18, wherein coupling the current generator circuit to the first circuit comprises coupling the output terminal pair of the current generator circuit to input terminals of the first circuit, the first circuit including a variable gain amplifier (VGA) core circuit, and wherein the coupling current generator circuit improves at least one of a frequency response or linearity characteristics of the VGA core circuit.

* * * * *